(12) United States Patent
Bieselt

(10) Patent No.: US 9,716,015 B2
(45) Date of Patent: Jul. 25, 2017

(54) CARRIER AND A METHOD FOR PROCESSING A CARRIER

(71) Applicant: Infineon Technologies Dresden GmbH, Dresden (DE)

(72) Inventor: Steffen Bieselt, Wehlen (DE)

(73) Assignee: INFINEON TECHNOLOGIES DRESDEN GMBH, Dresden (DE)

( * ) Notice: Subject to any disclaimer, the term of this patent is extended or adjusted under 35 U.S.C. 154(b) by 0 days.

(21) Appl. No.: 14/977,708

(22) Filed: Dec. 22, 2015

(65) Prior Publication Data

US 2016/0118270 A1    Apr. 28, 2016

Related U.S. Application Data

(62) Division of application No. 14/098,580, filed on Dec. 6, 2013, now Pat. No. 9,263,357.

(51) Int. Cl.
| | |
|---|---|
| H01L 21/76 | (2006.01) |
| H01L 21/48 | (2006.01) |
| H01L 21/02 | (2006.01) |
| H01L 21/762 | (2006.01) |
| H01L 23/053 | (2006.01) |
| H05K 1/02 | (2006.01) |
| H01L 21/764 | (2006.01) |

(52) U.S. Cl.
CPC ...... *H01L 21/481* (2013.01); *H01L 21/02104* (2013.01); *H01L 21/764* (2013.01); *H01L 21/76224* (2013.01); *H01L 21/76283* (2013.01); *H01L 23/053* (2013.01); *H05K 1/02* (2013.01); *H01L 2924/0002* (2013.01); *Y10T 428/13* (2015.01)

(58) Field of Classification Search
CPC .................................................. H01L 21/76289
USPC .......................................... 438/411, 412, 422
See application file for complete search history.

(56) References Cited

U.S. PATENT DOCUMENTS

| | | | |
|---|---|---|---|
| 5,227,658 A | 7/1993 | Beyer et al. | |
| 5,972,758 A * | 10/1999 | Liang | H01L 21/762 438/422 |
| 6,433,401 B1 | 8/2002 | Clark et al. | |
| 7,173,192 B1 | 2/2007 | Griese et al. | |
| 7,589,995 B2 | 9/2009 | Tang et al. | |
| 8,268,698 B2 | 9/2012 | Henson et al. | |
| 8,481,400 B2 * | 7/2013 | Kautzsch | B81C 1/00182 438/411 |

(Continued)

FOREIGN PATENT DOCUMENTS

| | | |
|---|---|---|
| CN | 1156888 C | 7/2004 |
| CN | 102097441 A | 6/2011 |

(Continued)

*Primary Examiner* — Chandra Chaudhari
(74) *Attorney, Agent, or Firm* — Viering, Jentschura & Partner mbB

(57) ABSTRACT

According to various embodiments, a carrier may include: a hollow chamber spaced apart from a surface of the carrier; and at least one support structure within the hollow chamber connecting a first region of the carrier disposed over the hollow chamber with a second region of the carrier disposed below the hollow chamber, wherein at least a part of a surface of the at least one support structure is spaced apart from an inner surface of the hollow chamber, and wherein the at least one support structure includes an electrically insulating material.

19 Claims, 15 Drawing Sheets

(56) References Cited

U.S. PATENT DOCUMENTS

| | | |
|---|---|---|
| 8,772,126 B2 | 7/2014 | Schulze et al. |
| 8,975,684 B2 | 3/2015 | Sim et al. |
| 9,054,671 B2 | 6/2015 | Adkisson et al. |
| 9,263,357 B2 | 2/2016 | Bieselt |
| 2004/0026761 A1 | 2/2004 | Leonardi et al. |
| 2005/0029501 A1 | 2/2005 | Geusic et al. |
| 2005/0062080 A1 | 3/2005 | Nakamura et al. |
| 2005/0218755 A1 | 10/2005 | Song et al. |
| 2006/0131651 A1 | 6/2006 | Sato et al. |
| 2006/0138541 A1 | 6/2006 | Nakamura et al. |
| 2006/0194410 A1 | 8/2006 | Sugaya |
| 2007/0023899 A1 | 2/2007 | Yudasaka |
| 2007/0085131 A1 | 4/2007 | Matsuo et al. |
| 2008/0095531 A1 | 4/2008 | Yeo et al. |
| 2008/0158649 A1 | 7/2008 | Park et al. |
| 2010/0078757 A1 | 4/2010 | Eun |
| 2010/0207206 A1 | 8/2010 | Krischke et al. |
| 2011/0133186 A1 | 6/2011 | Barlocchi et al. |
| 2013/0001682 A1 | 1/2013 | Tang et al. |
| 2013/0020718 A1 | 1/2013 | Chou |
| 2013/0134530 A1 | 5/2013 | Kautzsch et al. |
| 2013/0256800 A1 | 10/2013 | Qiao et al. |
| 2014/0353741 A1 | 12/2014 | Montanini et al. |

FOREIGN PATENT DOCUMENTS

| | | |
|---|---|---|
| CN | 102408092 A | 4/2012 |
| CN | 102640272 A | 8/2012 |
| CN | 103022006 A | 4/2013 |
| WO | 2011068037 A1 | 6/2011 |
| WO | 2013068169 A2 | 5/2013 |

\* cited by examiner

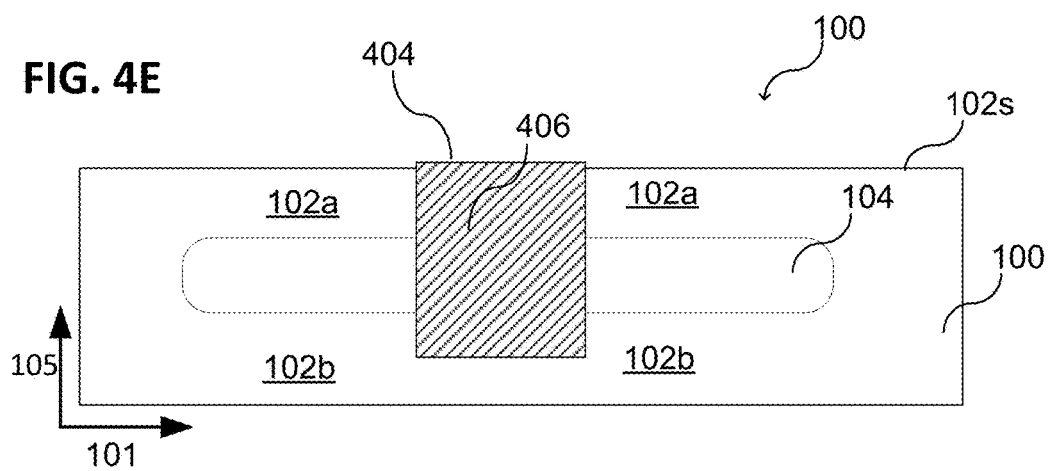
FIG. 4E
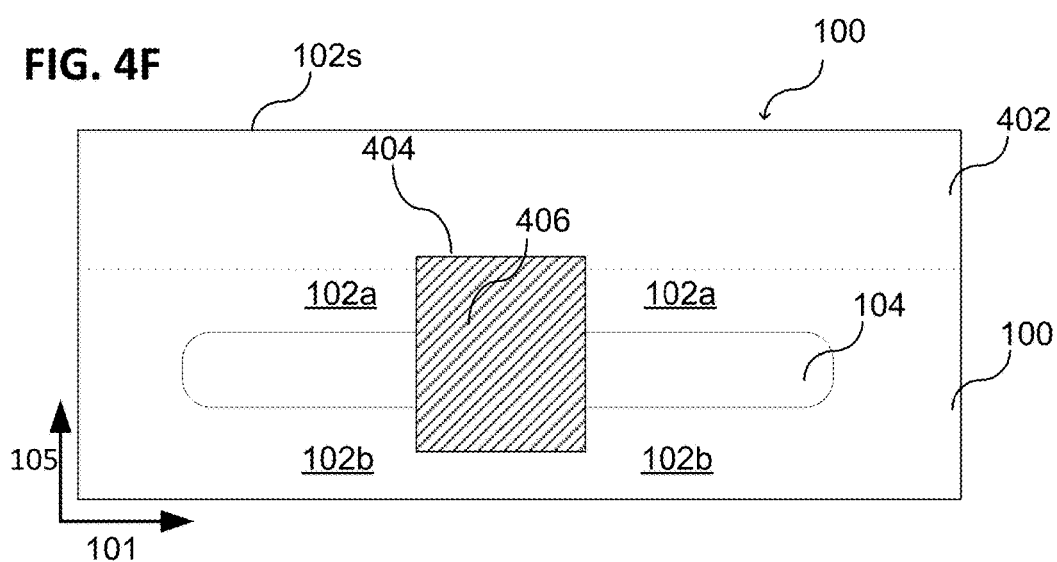
FIG. 4F
FIG. 4G
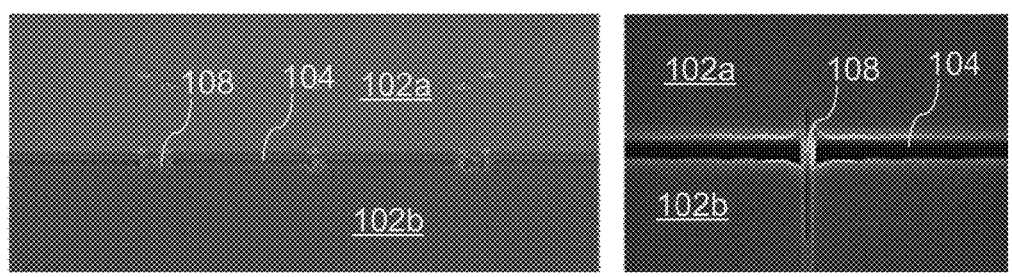

CARRIER AND A METHOD FOR PROCESSING A CARRIER

CROSS-REFERENCE TO RELATED APPLICATIONS

The present application is a divisional of U.S. patent application Ser. No. 14/098,580 filed Dec. 6, 2013, the entirety of which is herein incorporated by reference.

TECHNICAL FIELD

Various embodiments relate generally to a carrier and a method for processing a carrier.

BACKGROUND

In general, there may be a variety of applications in microelectronics, microsystems, biomedical, and other fields for thin chips or ultra-thin chips being formed for example on a carrier having a thickness in the range of about several tens of micrometers. Further, various processes may be utilized for providing an electrically isolated region in a carrier. Commonly used processes may allow for example forming a so-called silicon on insulator (SOI) structure or silicon on nothing (SON) structure, wherein a thin silicon region may be electrically isolated from the rest of the carrier. The silicon on insulator technology may include for example forming a buried oxide layer within a carrier and thereby providing an electrically isolated thin silicon region over the buried oxide layer. A silicon on nothing structure may be provided by applying a so-called empty space in silicon technique. However, applying commonly used processes for manufacturing an electrically isolated carrier region may for example firstly entail high costs for providing the specific structures in the carrier and secondly the complex processes may be prone to errors resulting for example in defect structures.

SUMMARY

According to various embodiments, a carrier may include: a hollow chamber spaced apart from a surface of the carrier; and a support structure within the hollow chamber connecting a first region of the carrier disposed over the hollow chamber with a second region of the carrier disposed below the hollow chamber, wherein at least a part of a surface of the support structure is spaced apart from an inner surface of the hollow chamber, and wherein the support structure includes an electrically insulating material.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIGS. 4E and 4F show respectively a schematic cross sectional view or a side view of a carrier during processing, according to various embodiments;

FIG. 4G shows scanning electron microscopy images of a carrier during processing of the carrier, according to various embodiments;

DESCRIPTION

Figure 1A:
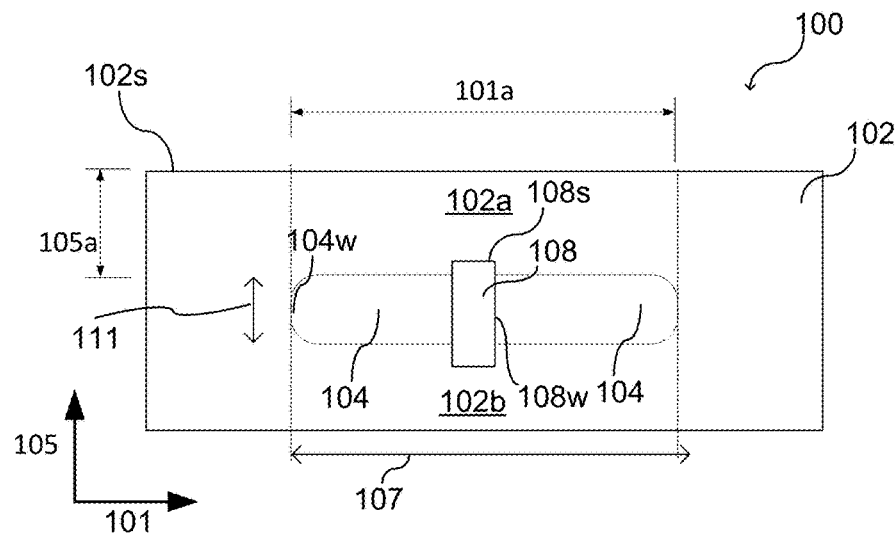
FIG. 1A shows a schematic cross sectional view or side view of a carrier, according to various embodiments.

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface or deposit a layer "over" a carrier, may be used herein to mean that the deposited material may be formed "directly on", e.g. in direct contact with, the implied side, surface, or carrier. The word "over" used with regards to a deposited material formed "over" a side or surface or to deposit a layer "over" a carrier, may be used herein to mean that the deposited material may be formed "indirectly on" the implied side, surface, or carrier with one or more additional layers being arranged between the implied side, surface, or carrier and the deposited material.

The term "lateral" used with regards to the "lateral" extension of a structure (or of a carrier), a lateral direction, or "laterally" adjacent, may be used herein to mean an extension along a direction parallel to a surface of a carrier or a direction parallel to a surface of a carrier. That means, a surface of a carrier (e.g. a surface of a substrate, or a surface of a wafer) may serve as reference, commonly referred to as the main processing surface of a carrier (or the main processing surface of another type of carrier). Further, the term "width" used with regards to a "width" of a structure (or of a structure element, e.g. a cavity, e.g. a hollow chamber) may be used herein to mean the lateral extension of a structure. Further, the term "height" used with regards to a height of a structure (or of a structure element), may be used herein to mean an extension of a structure along a direction perpendicular to the surface of a carrier (e.g. perpendicular to the main processing surface of a carrier). Further, the term "depth" used with regards to a depth of a recess (or of a structure element), may be used herein to mean an extension of a recess along a direction perpendicular to the surface of a carrier (e.g. perpendicular to the main processing surface of a carrier). Further, a "vertical" structure may be referred to as a structure extending in a direction perpendicular to the lateral direction (e.g. perpendicular to the main processing surface of a carrier) and a "vertical" extension may be referred to as an extension along a direction perpendicular to the lateral direction (e.g. an extension perpendicular to the main processing surface of a carrier).

The word "cover" used with regards to deposited material covering a structure (or a structure element), may be used herein to mean that a deposited material may cover a structure (or a structure element) completely, e.g. covering all exposed sides and surfaces of a structure. The word "cover" used with regards to deposited material covering a structure (or a structure element), may be used herein to mean that the deposited material may cover a structure at least partially, e.g. a material may at least partially cover the exposed sides and surfaces of a structure.

According to various embodiments, a hollow chamber may for example be also filled with a material, e.g. a hollow chamber in a silicon wafer may be filled or partially filled with silicon oxide. Therefore, the term "hollow" used with regards to a "hollow" chamber may be used herein to mean that the hollow chamber itself (e.g. a cavity, e.g. a void, e.g. a hollow structure) may be free of material. However, a hollow chamber may be partially filled with a filling material, or may be completely filled with a filling material. Referring to this, the hollow chamber may be partially filled or completely filled with another material than the material providing the hollow chamber.

According to various embodiments, forming a layer (e.g. depositing a layer, depositing a material, and/or applying a layering process), as described herein, may also include forming a layer, wherein the layer may include various sub-layers, whereby different sub-layers may include different materials respectively. In other words, various different sub-layers may be included in a layer, or various different regions may be included in a deposited layer and/or in a deposited material.

According to various embodiments, a method for processing a carrier, as described herein, may include several basic semiconductor manufacturing techniques which may be used at least one in the overall manufacturing process or at least one in at least one during processing of a carrier. The following description of basic techniques should be understood as illustrating examples, which techniques may be included in the processes described herein. The exemplarily described basic techniques may be not necessarily need to be construed as preferred or advantageous over other techniques or methods, since they only serve to illustrate how one or more embodiments of the invention may be practiced. For sake of brevity, the illustration of exemplarily described basic techniques may be only a short overview and should not be considered as exhaustive specification.

According to various embodiments, a layering process (or layering) may be included in a method for processing a carrier or in another process or method described herein. In a layering process, a layer may be deposited over a surface (e.g. over a carrier, over a wafer, over a substrate, over another layer, or the like) using deposition techniques, which may include chemical vapor deposition (CVD, or a CVD process) and physical vapor deposition (PVD, or a PVD process), according to various embodiments (a layering process may therefore include depositing a material). According to various embodiments, the thickness of a deposited layer may be in the range of a few nanometers up to several micrometers depending on its specific function. Further, according to various embodiments, a layer may include at least one of an electrically insulating material, an electrically semiconducting material, and an electrically conductive material, depending on the respective specific function of the layer. According to various embodiments, modifications of PVD and CVD processes may be used in the method for processing a carrier, e.g. for depositing an electrically insulating layer or filling a hollow structure with an electrically conductive material.

According to various embodiments, a chemical vapor deposition process (CVD process) may include a variety of modifications, as for example atmospheric pressure CVD (APCVD), low pressure CVD (LPCVD), ultrahigh vacuum CVD (UHVCVD), plasma enhanced CVD (PECVD), high density plasma CVD (HDPCVD), remote plasma enhanced CVD (RPECVD), atomic layer deposition (ALD), atomic layer CVD (ALCVD), vapor phase epitaxy (VPE), metal organic CVD (MOCVD), hybrid physical CVD (HPCVD), and the like. According to various embodiments, a layering process may further include forming a resist layer or depositing a resist layer, e.g. using spin coating, spray coating, and the like.

According to various embodiments, a patterning process (or patterning) may be included in a method for processing a carrier or in another process or method described herein. The patterning process may include for example removing selected portions of a surface layer and/or removing selected portions of a material. According to various embodiments, a plurality of trenches, recesses and/or holes may be formed in a carrier or in a surface layer of a carrier using a patterning process. Further, patterning a layer may be used to form a patterned layer, e.g. a mask layer. Since a plurality of processes may be involved, according to various embodiments, there are various possibilities to perform a patterning process, wherein aspects may be: selecting at least one portion of a surface layer (or of a material or of a carrier) which shall be removed, e.g. using at least one lithographic process; and removing the selected portions of a surface layer, e.g. using at least one etch process.

According to various embodiments, a variety of lithographic processes may be applied to generate a mask layer (e.g. a patterned resist layer), for example photolithography, microlithography or nanolithography, electron beam lithography, X ray lithography, ultraviolet lithography, extreme ultraviolet lithography, interference lithography, and the like. A lithographic process may include at least one of an initial cleaning process, a preparation process, applying a resist (e.g. a photoresist), exposing the resist (e.g. exposing the photoresist to a pattern of light), developing the resist (e.g. developing the photoresist using a chemical photoresist developer).

According to various embodiments, an initial cleaning process or a cleaning process, which may be included in a lithographic process, may be applied to remove organic or inorganic contaminations from a surface (e.g. from a surface layer, from a carrier, from a wafer, and the like) by for example wet chemical treatment. According to various embodiments, a cleaning process (e.g. chemical mechanical polishing (CMP)) may also be applied to remove an oxide layer (e.g. a thin silicon oxide layer) from a surface (e.g. from a surface layer, from a carrier, or from a wafer, and the like).

According to various embodiments, applying a metallization process may further include a planarization of the carrier surface (wafer surface, substrate surface, and the like) and/or a planarization of intermediate layers included in a multilevel metallization process (e.g. using chemical mechanical polishing).

According to various embodiments, a planarization process may be applied as for example to reduce the surface roughness or the reduced variations in the depth profile of a carrier or a wafer surface including structure elements having different heights, since some processes may require a flat surface (a planar surface) (e.g. high resolution lithography). According to various embodiments, a planarization process may be necessary as the number of performed layering processes and patterning processes increases and as a planar surface may be required. According to various embodiments, a chemical mechanical polishing process (CMP or CMP process) may be performed, wherein this process may be selective to specific materials on the surface of a carrier (of a wafer, substrate, surface layer, and the like). According to various embodiments, a chemical mechanical polishing process (CMP or CMP process) may be performed, wherein this process may be non-selective to specific materials on the surface of a carrier (of a wafer, substrate, surface layer, and the like). According to various embodiments, a planarization process may be included additionally in several processes, e.g. in layering processes, patterning processes, and the like.

According to various embodiments, a resist may be applied to cover a surface (e.g. a surface layer, a carrier, or a wafer, and the like). According to various embodiments, applying a resist may include spin coating or spray coating to generate a resist layer. According to various embodiments, a resist may be exposed (e.g. by exposing a resist to a pattern of light) to transfer a desired pattern to a resist, e.g. using light or electrons, wherein the desired pattern may be defined by a patterned lithographic mask (e.g. a glass carrier with a patterned chromium layer used for exposing the resist layer).

According to various embodiments, a lithographic process may include developing a resist (e.g. developing a photoresist using a photoresist developer) to partially remove the resist to generate a patterned resist layer (e.g. on a surface layer or on a carrier, a wafer, and the like). According to various embodiments, the developing process may include a special chemical solution (a so called developer) as for example sodium hydroxide or tetramethylammonium hydroxide (TMAH, a metal ion free developer). According to various embodiments, the patterned resist layer may be solidified in a hard bake process (a heat treatment, e.g. rapid thermal processing), realizing a more durable protecting layer for later processes.

Independently of the described lithographic processes, a resist layer or a patterned resist layer may be removed completely (or partially) at a desired processing stage (e.g. after a trench has been etched or a carrier has been patterned) in a so called resist strip process. According to various embodiments, a resist may be removed chemically and/or by using oxygen plasma.

It should be noted, that a lithographic process, including for example exposing a resist and developing a resist may also be considered as a patterning process, wherein a patterned resist layer (a soft mask, or a resist mask) may be generated by the lithographic process. Further, according to various embodiments, subsequently using an etch process a pattern can be transferred from a patterned resist layer to a prior deposited or grown layer, wherein the previously deposited or grown layer may include a hard mask material as for example an oxide or a nitride (e.g. silicon oxide, e.g. silicon nitride) creating a so-called hard mask.

According to various embodiments, an etch process, which may be included in a patterning process, may be applied to remove material from a prior deposited layer, a grown surface layer, or from a carrier (or substrate, or wafer), and the like. According to various embodiments, a patterned layer of a hard mask material (e.g. silicon nitride) may serve as a mask for processes like etching or forming recesses, trenches, or holes at desired positions into a carrier or into a surface layer. Further, according to various embodiments, a patterned photoresist may also serve as a mask (a so called soft mask). The mask material may usually be selected with regard to specific needs as for example chemical stability or mechanical stability, e.g. to protect regions from being etched, or to define the shape of structure elements to be generated during a layering process, and the like.

According to various embodiments, some stages during processing a carrier may require a conformally deposited layer or may require conformally depositing a layer (e.g. for forming a layer over a sidewall of a structure element or covering an inner sidewall or surface of a cavity), which means that a layer (or a material forming a layer) may exhibit only small thickness variations along an interface with another body, e.g. a layer may exhibit only small thickness variations along edges, steps or other elements of the morphology of the interface. According to various embodiments, layering processes such as plating, atomic layer deposition (ALD), or several CVD processes (e.g. ALCVD, or LPCVD) may be suitable to generate a conformal layer or a conformally deposited layer of a material. According to various embodiments, using for example an atomic layer deposition (ALD) process, a structure having a high aspect ratio (e.g. larger than 5, e.g. larger than 10, e.g. larger than 20) may be conformally covered with a layer or thin film. Further, according to various embodiments, using for example an atomic layer deposition (ALD) process, the inner surface (e.g. inner sidewall) of a cavity or hollow chamber may be covered (completely or partially) with a conformal layer or a conformal thin film. In other words, using atomic layer deposition may allow coating the inner surface (e.g. inner sidewall) of a cavity or a cavity structure with a material layer (e.g. with a conformal material layer), if the cavity or the cavity structure may have at least one opening such that the material forming the material layer may reach the interior of the cavity or the cavity structure. Further, using atomic layer deposition may allow filling a hollow chamber completely, if the hollow chamber has at least one opening.

According to various embodiments, a carrier, as described herein, (e.g. a substrate, a wafer, and the like) may be made of semiconductor materials of various types, including silicon, germanium, Group III to V or other types, including polymers, for example, although in another embodiment, other suitable materials can also be used. In an embodiment, the wafer substrate is made of silicon (doped or undoped). As an alternative, any other suitable semiconductor materials can be used for the wafer substrate, for example semiconductor compound material such as gallium arsenide (GaAs), indium phosphide (InP), but also any suitable ternary semiconductor compound material or quaternary semiconductor compound material such as indium gallium arsenide (InGaAs). According to various embodiments, the carrier may include one or more doped regions, e.g. providing one or more p-n-junctions in the carrier.

According to various embodiments, a method for processing a carrier is described, wherein this method may be used to form an electrically isolated region in a silicon wafer or silicon carrier, a SOI-structure (silicon-on-insulator structure). Further, according to various embodiments, a carrier may be provided including a separated silicon region (e.g. electrically isolated and/or spatially separated silicon region) in a carrier, a SON-structure (silicon-on-nothing structure). Commonly used technologies including an electrically isolated a region in the carrier may include for example utilizing a SOI-substrate (a silicon-on-insulator substrate), wherein a buried oxide layer (e.g. in a depth of several micrometers) electrically isolates a thin active silicon layer at the surface of the substrate. Using a SOI-substrate for manufacturing an electronic device may be an expensive option for realizing an electrically isolated region in the carrier. Another option may be the formation of a local buried oxide layer, a local SOI-region, e.g. by applying a so-called silicon-on-nothing-process (also called venezia process or venetia process) or the so-called empty space in silicon technique. Referring to this, an electrically isolated region may be formed in the carrier by forming a trench structure and performing a high temperature process to form a planar cavity or a tube-like cavity from the trench structure. Illustratively, the trench structure may be transformed via an annealing process into one or more cavities (hollow chambers) depending on the design of the trench structure. As a result, a local (laterally limited) isolation may be provided below a silicon region by the one or more cavities. In a further process, the region over the one or more cavities may be isolated laterally, e.g. by etching a trench into the carrier and filling the trench with a material. However, commonly used carrier designs and silicon-on-nothing processes may not allow forming a cavity with a large lateral extension, e.g. larger than several tens of micrometers, due to the complex diffusion and/or migration based forming process.

In general, a commonly used silicon-on-nothing-process for forming an electrically isolated region in the carrier may be prone to problems regarding the stability of the process and/or the mechanical stability of the processed structures. A commonly processed silicon-on-nothing structure (e.g. a separated silicon region or an electrically isolated silicon region in the carrier) may be connected to the rest of the carrier by reaming carrier material between buried tube-like cavities below the separated silicon region. The reaming carrier material between respectively two adjacent cavities may provide a mechanical support for the silicon region over the plurality of cavities. Illustratively, the mechanical support for the isolated silicon region may be provided by forming a plurality of cavities in a defined distance to each other, wherein the material between the adjacent cavities of the plurality of cavities may be thermally oxidized. However, it may be difficult to generate such (e.g. buried tube-like) cavities, since the supports between adjacent cavities may have a precisely controlled width; since, firstly, a too small width of a support may reduce the stability of the venezia structure (of the silicon region over the plurality of cavities) and further, the support may be completely removed by typically occurring small process fluctuations, and, secondly, a too large width of the support may cause a non-tolerable bow of the carrier during thermally oxidizing the supports to realize the electrical isolation of the silicon region above the cavities carried by the supports. If the support below the silicon region is processed under process conditions outside a very narrow window of optimal process conditions (e.g. due to typically occurring process fluctuations), the silicon region may have no or a too weak connection to the carrier after a further trench structure is formed for the lateral electrical isolation, and therefore, a further processing of the carrier may be impossible since the silicon region may detach from the carrier.

Illustratively, providing the supports for a silicon on nothing structure below the separated silicon region by a plurality of tube-like cavities having a defined distance between each other may be associated with a precisely controlled processing which may be prone to errors and which may result in a low cost efficiency. Further, the thermal oxidation of the buried cavities may be difficult to be controlled; the oxidation may be for example incomplete after a thermal oxidation process has been performed, such that undesired leakage currents may flow from the silicon region to the carrier. Further, the incomplete (partially) oxidizing of the buried cavities may cause a high input of mechanical stress into the carrier which may lead to an undesired bow of the carrier. Further, using buried structures to support the separated silicon region may result in the problem, that it may be difficult or even impossible to perform a direct test, whether the oxidation process was successful or not.

Various embodiments may be based on the understanding of the aforementioned problems occurring during providing a separated silicon region (a SOI-structure or a SON-structure).

According to various embodiments, a silicon region may be provided in a carrier, wherein the silicon region may be electrically isolated from below via a cavity (hollow chamber) and one or more pillars extending through the cavity. Therefore, one or more pillars may be formed into a carrier and subsequently a venetia process may be utilized to form a cavity laterally surrounding the one or more pillars and thereby vertically isolating and/or separating a silicon region over the cavity. The silicon region over the cavity may be carried by the one or more pillars. Illustratively, according to various embodiments, utilizing the one or more pillars (e.g. including an oxide, e.g. silicon oxide) to form a cavity laterally extending in the carrier may allow forming a single cavity (and therefore a silicon region above the single cavity) with a large lateral extension (e.g. larger than about 100 μm), which would be not possible without support structures within the cavity, since the lateral extension of a non-supported cavity formed by a venetia process may be limited (e.g. limited to about 50 μm). Alternatively, the cavity may be formed using other techniques, e.g. by annealing a porous structure or annealing one or more porous regions in the carrier, wherein the porous structure or the one or more porous regions may be formed in the carrier laterally surrounding the one or more pillars.

Various embodiments may be based on the finding, that an oxide structure (e.g. a structure including an oxide or consisting of an oxide) may provide a stable region in a silicon wafer during an anneal process for forming a cavity in the silicon wafer (e.g. during a venezia process). Further, the oxide structure may be surrounded with a nitride liner, e.g. such that a structure may be provided including for example a silicon oxide core being surrounded by a silicon nitride liner or a silicon nitride sheathing.

According to various embodiments, the nitride liner surrounding the oxide pillar (or surrounding a support structure including an oxide) may protect the pillar during the venetia process. Therefore, the more stable silicon on nothing process may be used for providing silicon on insulator structures and/or silicon on nothing structures.

The carrier design described in the following, according to various embodiments, may be more stable and easier to control than the commonly used process based on forming a plurality of tube-like buried (SOI) cavities.

Further, the carrier design and the method for processing a carrier described in the following, according to various embodiments, may allow forming an isolated silicon region in a carrier without using a thermal oxidation process to oxidize support structures below the silicon region. This may avoid a stress input into the carrier and/or into the silicon region.

Further, a trench structure may be provided laterally surrounding the isolated silicon regions in a carrier, wherein a trench isolation may be formed without introducing mechanical stress into the silicon on nothing structure or silicon on insulator structure. This may allow reducing the mechanical stress, extending the process window, and may enable new possibilities of integration and application. Illustratively, a support structure may be provided for supporting a silicon region, wherein the silicon region may be electrically isolated from the carrier via the support structure, wherein the support structure may be formed using layering processes based on CVD and/or PVD avoiding the need of a thermal oxidation process.

Further, the carrier design and the method for processing a carrier described in the following, according to various embodiments, may be applied on wafer-level, which may allow a processing without an additional planarization process, since the venetia "fade out zone" may be moved into the unused wafer edge region. Further, the following lithography plane may be exposed as first layer, such that overlay errors (or problems due to the overlay) may be reduced, which may occur after processing an epitaxial layer over a locally formed empty space (cavity) in silicon.

According to various embodiments, one or more oxide pillars may be provided within a cavity (hollow chamber), the cavity vertically separating a silicon region above the cavity, and the one or more oxide pillars carrying the silicon region. The one or more oxide pillars may be electrically insulating and may extend through the cavity. The cavity may completely laterally surround the one or more oxide pillars, e.g. each pillar of the one or more oxide pillars. According to various embodiments, a pillar within the cavity may also be referred to as support structure, since the pillar may carry the silicon region over the cavity. According to various embodiments, the cavity may be free of carrier material, e.g. free of silicon.

According to various embodiments, the processes described herein may be applied on the whole carrier, e.g. on the whole main processing surface of a silicon wafer, or may be applied on a local area of the carrier. This may allow forming a local SON-structure or forming a SON-Wafer.

Encapsulating an oxide structure (e.g. including silicon oxide) with a nitride liner (e.g. including silicon nitride) may allow forming structures in the carrier being able to withstand a venetia process (e.g. a high temperature annealing) without being deformed and/or destroyed. This may be utilized for integrating MEMS structures into a carrier being subjected to a venetia process (or into a high temperature annealing process).

According to various embodiments, an implementation of the method for processing a carrier, as described herein, may be manufacturing an entire SON-wafer with a cavity (hollow chamber) laterally extending continuously through the carrier, wherein the separated silicon region over the cavity may be supported by the one or more support structures in the cavity, wherein, during subsequently performed processes, the carrier may be processed design-independently. According to various embodiments, the depth of the cavity may be adapted by forming an epitaxial silicon layer over the carrier after the cavity has been formed.

According to various embodiments, as described herein, the carrier may be used for manufacturing a cost efficient local SOI-structure or SON-structure with a uniformly extending hollow chamber (cavity) below the SOI-structure or SON-structure. This may be used in MEMS (microelectromechanical systems) or in applications like resonators and integrated high voltage devices.

Further, the carrier design and the method for processing the carrier may be used for manufacturing a SOI-structure or a SON-structure for power applications, logic circuits, and/ or MEMS on ultra-thin silicon. Thereby, a SOI-structure or a SON-structure may be formed in a carrier providing an ultra-thin chip and subsequently an electronic circuit or a MEMS may be formed on the ultra-thin chip, wherein the ultra-thin chip may be separated after processing via a plasma dicing process through the back-end-of-line stack with a subsequently performed process that may include picking the chip, cracking the connection (provided by the support structure) between the chip and the carrier, and placing the chip (e.g. onto another carrier, e.g. lead frame), e.g. a so-called Pick, Crack & Place™ process.

FIG. 1A illustrates a carrier 100 in a schematic side view or cross sectional view, according to various embodiments, wherein the carrier may include a hollow chamber 104 spaced apart from a surface 102s of the carrier 100. The carrier 100 may further include a support structure 108 within the hollow chamber 104, the support structure 108 connecting a first region 102a of the carrier 100 disposed over the hollow chamber 104 with a second region 102b of the carrier disposed below the hollow chamber 104, wherein the support structure 106 may include an electrically insulating material. Further, at least a part of a surface 108w of the support structure 108 may be spaced apart from an inner surface 104w of the hollow chamber 104. Illustratively, the support structure 108 may not completely fill the hollow chamber 104.

According to various embodiments, the hollow chamber 104 may be defined by the inner surface 104w (the inner wall) of the hollow chamber 104 provided by the carrier material, e.g. by the silicon of the carrier 100. Further, at least a part of a surface 108w of the support structure 108 (e.g. a part of the surface laterally limiting the support structure) may be spaced apart from the inner surface 104w of the hollow chamber 104. According to various embodiments, one or more sidewalls 108w of the support structure 108 may be laterally spaced apart from the inner surface 104w defining the hollow chamber 104.

According to various embodiments, the carrier 100 may include a silicon substrate, a silicon carrier, or a silicon wafer. The carrier may further include another material; the carrier may be for example a layered carrier including at least a silicon layer 102 as top layer. In other words, at least the surface layer 102 or the surface region 102 of the carrier 100 may include silicon. The surface region 102 may be a part of the carrier 100 or may be formed over the carrier 100. Alternatively, the carrier 100 may include a semiconductor substrate, a semiconductor carrier, or a semiconductor wafer including for example germanium.

The upper surface 102s of the carrier, the upper surface 102s of the surface layer 102, or the upper surface 102s of the surface region 102 of the carrier 100 may define a lateral direction 101. According to various embodiments, the hollow chamber 104 included in the carrier 100 may be formed within the surface region 102 of the carrier 100, wherein the hollow chamber 104 may be disposed spaced apart from the upper surface 102s. The distance 105a between the upper surface 102s and the hollow chamber 104, e.g. the vertical distance perpendicular to the lateral direction 101, may define the height 105a of the first region 102a of the carrier 100. The height 105a of the first region 102a of the carrier 100 may be in the range from about several hundreds of nanometers to about several micrometers or to about several tens of micrometers, e.g. in the range from about 100 nm to about 50 µm, e.g. in the range from about 1 µm to about 30 µm, e.g. in the range from about 1 µm to about 10 µm.

Further, the width 101a of the first region 102a of the carrier 100 may be defined by the width of the hollow chamber 104 (the hollow chamber 104 may laterally extend within the carrier 100). In other words, the first region 102a may be the region of the carrier 100 being disposed over the hollow chamber 104, e.g. the first region 102a of the carrier 100 may be vertically separated or electrically isolated from the second region 102b of the carrier 100 below the hollow chamber 104. The width 101a of the first region 102a of the carrier 100 may be in the range from about several hundreds of nanometers to about several micrometers, or to about several tens of micrometers, or to about several hundreds of micrometers, or to about several millimeters, or to about several centimeters, or to about several tens of centimeters (e.g. up to 30 cm or even more than 30 cm). Referring to this, the hollow chamber 104 may have the same lateral extension 107 as the first region 102a of the carrier 100. The first region 102a of the carrier 100 may be also referred to as cap region, since the first region 102a of the carrier 100 may be disposed over the hollow chamber 104.

According to various embodiments, the inner sidewall of the hollow chamber 104 may be curved or may have a curved shape, depending for example on the method for forming the hollow chamber 104 in the carrier 100. According to various embodiments, the hollow chamber 104 may vertically separate the first region 102a of the carrier 100 from the second region 102b of the carrier 100, wherein the second region 102b of the carrier 100 may be disposed or may extend below the first region 102a of the carrier 100. The height 111 of the hollow chamber 104 may be in the range from about several tens of nanometers to about several micrometers, e.g. in the range from about 50 nm to about 10 µm, e.g. in the range from about 100 nm to about 1 µm. The hollow chamber 104 may provide a gap or a gap structure between the first region 102a of the carrier 100 and the second region 102b of the carrier 100 such that there may be no other mechanical connection extending vertically between the first region 102a of the carrier 100 and the second region 102b of the carrier 100 than the support structure 108.

According to various embodiments, the first region 102a of the carrier 100 and/or the second region 102b of the carrier 100 may include or may consist of silicon, e.g. doped silicon.

Figure 1B:
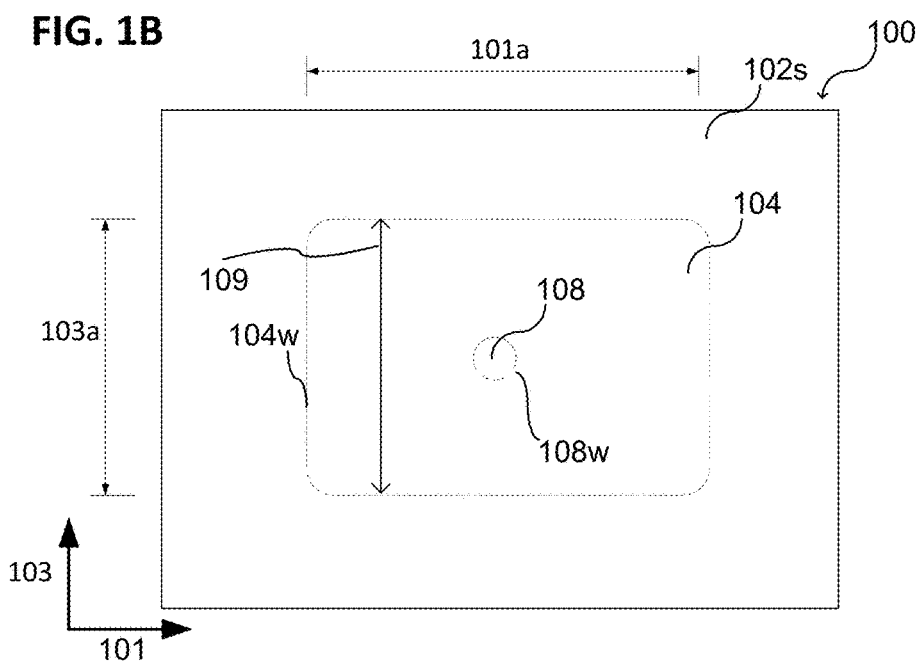
FIG. 1B shows a schematic top view of a carrier, according to various embodiments.

FIG. 1B shows a top view of the carrier 100 corresponding to the side view or cross sectional view shown in FIG. 1A. The hollow chamber 104 and the first region 102a may have a rectangular shape, seen from the top. Further, the hollow chamber 104 and accordingly the first region 102a may have any other processable shape which may be provided using semiconductor patterning processes, e.g. a quadratic shape, a circular shape, a polygonal shape, and the like. According to various embodiments, the hollow chamber 104 may, e.g. completely, laterally surround the support structure 108. As illustrated, the lateral extension 109 of the hollow chamber 104 along the direction 103 may define the lateral extension 103a of the first region 102a of the carrier 100 along the direction 103, wherein the lateral extension 109 of the hollow chamber 104 may be in a range from about several hundreds of nanometers to about several micrometers, or to about several tens of micrometers, or to about several hundreds of micrometers, or to about several millimeters, or to about several centimeters, or to about several tens of centimeters (e.g. up to 30 cm or even more than 30 cm).

According to various embodiments, the support structure 108 may be buried within the carrier 100, which means that the support structure 108 may not extend vertically through the first region 102a of the carrier 100, such that the upper surface 108s of the support structure 108 may be covered by a part of the first region 102a of the carrier 100. Alternatively, depending on the height of the support structure 108 compared to the height 111 of the hollow chamber 104 and the height 105a of the first region 102a of the carrier 100, the support structure 108 may extend through the first region 102a of the carrier 100, e.g. protruding from the surface 102s of the carrier 100 or being partially exposed at the surface 102s of the carrier 100.

Figure 1C:
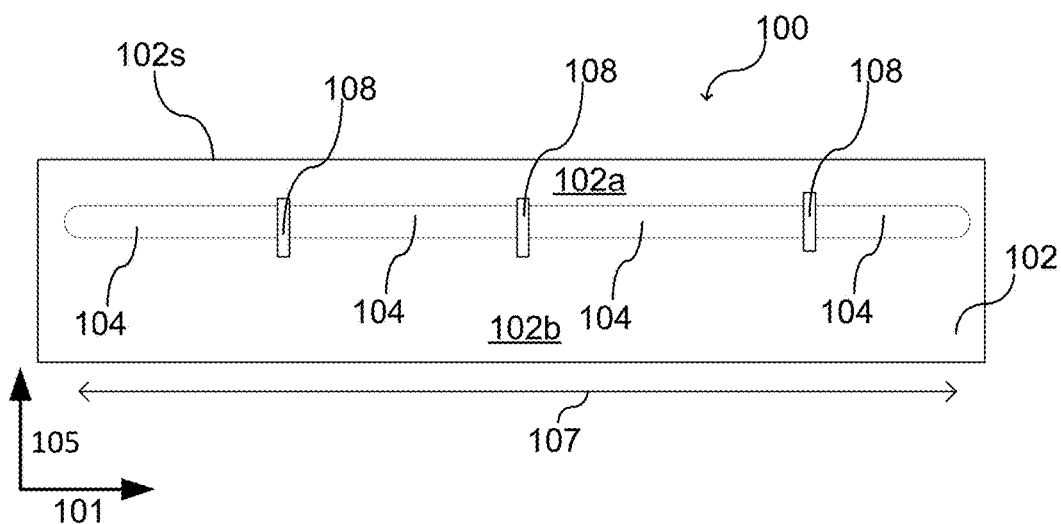
FIG. 1C shows a schematic cross sectional view or side view of a carrier, according to various embodiments.

As illustrated in FIG. 1C in a side view or cross sectional view, according to various embodiments, a plurality of support structures 108 (e.g. a plurality of pillars) may be disposed or formed in the hollow chamber 104 of the carrier 100. The hollow chamber 104 and the plurality of support structures 108 within the hollow chamber 104 may provide a SON-structure or an SOI-structure. According to various embodiments, a plurality of support structures 108 may be arranged within the hollow chamber 104, e.g. each being laterally free of material (e.g. solid material, e.g. material of the carrier) due to being arranged within the hollow chamber (cavity) 104.

According to various embodiments, the one or more support structures 108 being arranged within the hollow chamber 104 may be regarded as a support structure or support structure arrangement for stabilizing the first region 102a of the carrier 100 extending over the one or more support structures 108. The one or more support structures 108 and the hollow chamber 104 may electrically isolate the first region 102a of the carrier 100, e.g. at least along the vertical direction 105.

Figure 1D:
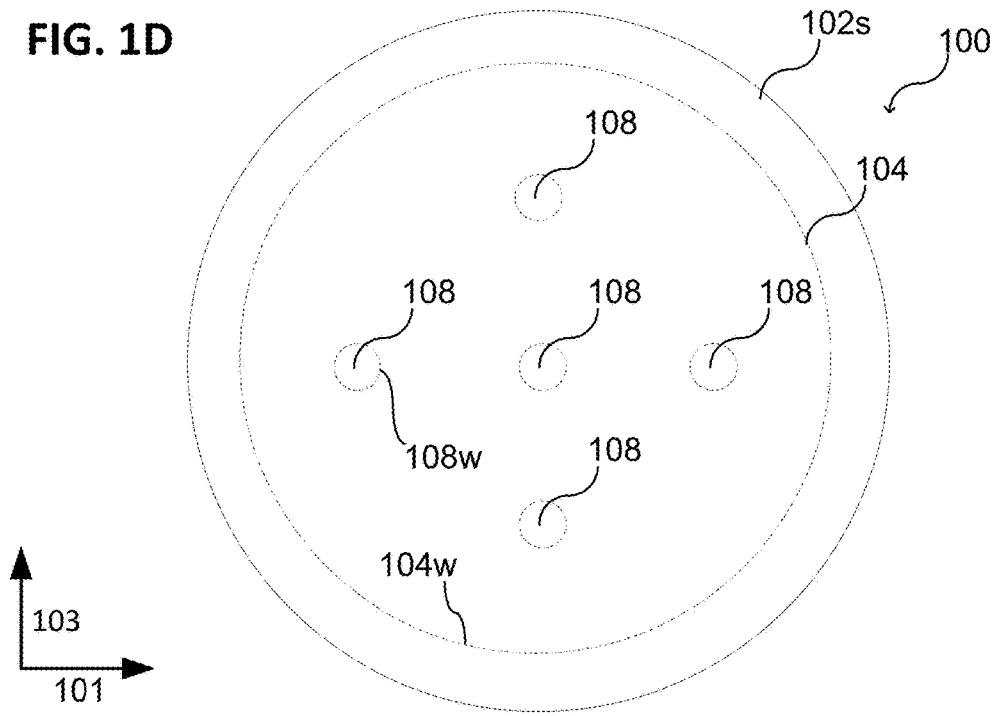
FIG. 1D shows a schematic top view of a carrier, according to various embodiments.

FIG. 1D shows a top view of the carrier 100 corresponding to the side view or cross sectional view shown in FIG. 1C. The carrier 100 may be a silicon wafer having for example a diameter of up to 300 mm or a diameter even larger than 300 mm. As illustrated in FIG. 1D, the first region 102a may have a circular shape. The support structures 108 may be arranged in the hollow chamber 104 extending respectively from the second region 102b of the carrier 100 to the first region 102a of the carrier 100. The lateral distance between respectively two adjacent support structures 108 (in other words, nearest-neighbor distance) may be in the range from about several tens of micrometers to about several hundreds of micrometers. Illustratively, the distance between the support structures 108 may influence the mechanical stability of the first region 102a of the carrier 100, such that the distance between the support structures 108 may be adapted to the desired needs, e.g. depending on the respective method for processing the carrier.

According to various embodiments, during a thermal treatment of the carrier 100, e.g. including heating the carrier to temperatures in the range from about 500° C. to about 1400° C., the carrier material, e.g. silicon, may start to migrate and/or diffuse, and the first region 102a of the carrier 100 may for example lose its mechanical stability which could lead to a collapsing of the hollow chamber 104. Referring to this, the one or more support structures 108 may provide a mechanical support such that a hollow chamber 104 with a large lateral extension, e.g. up to several centimeters, may be provided within the carrier.

Figure 1E:
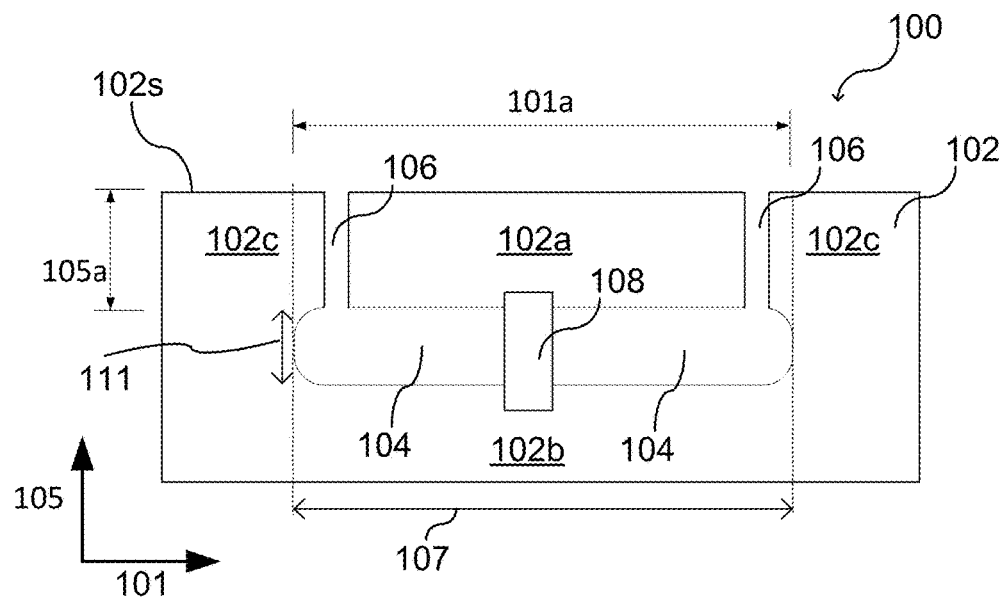
FIGS. 1E to 1G show respectively a schematic cross sectional view or side view of a carrier, according to various embodiments.

FIG. 1E illustrates a carrier 100 in a schematic side view or cross sectional view, according to various embodiments, wherein the carrier 100 may further include a trench structure 106 extending from the surface 102s of the carrier 100 to the hollow chamber 104 and laterally limiting the first region 102a of the carrier 100, the trench structure 106 may include one or more trenches extending from the surface 102s of the carrier 100 to the hollow chamber 104. Further, the trench structure 106 may include one or more lateral support structures (not shown) intersecting the one or more trenches and connecting the first region 102a of the carrier 100 with a third region 102c of the carrier 100 outside the trench structure 106. The trench structure 106 may laterally separate and/or laterally electrically isolate the first region 102a of the carrier 100. Therefore, the first region 102a of the carrier 100 may be completely electrically isolated from the rest of the carrier 100 (e.g. from the second region 102b and the third region 102c of the carrier 100). According to various embodiments, the first region 102a of the carrier 100 may be held (e.g. solely) by the support structure 108 within the hollow chamber 104.

According to various embodiments, the trench structure 106 or the one or more trenches included in the trench structure 106 may laterally separate the first region 102a of the carrier 100 from a third region 102c of the carrier 100 surrounding the first region 102a of the carrier 100 (the third region 102c surrounding the trench structure 106). The width of the one or more trenches or the width of the trench structure 106 may be in the range from about several tens of nanometers to about several micrometers, e.g. in the range from about 10 nm to about 10 μm, e.g. in the range from about 50 nm to about 1 μm.

Figure 1F:
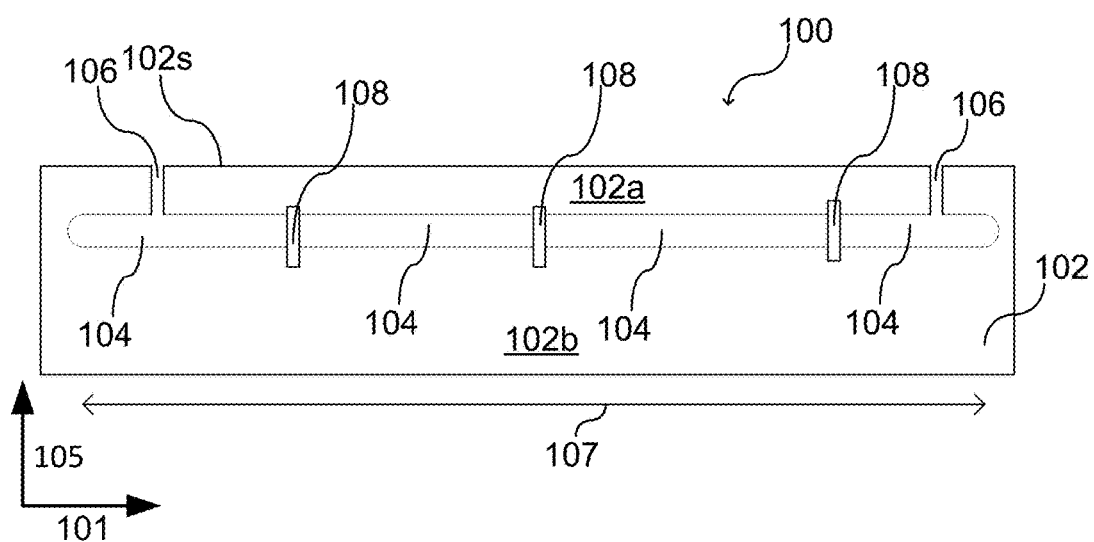

As illustrated in FIG. 1F, the first region 102a of the carrier 100 may have no direct contact to the rest of the carrier 100 or the rest of the surface region 102, wherein the first region 102a of the carrier 100 may be mechanically attached (or held) by the one or more support structures 108. Therefore, the first region 102a of the carrier 100 may be electrically isolated from the rest of the carrier 100 or the rest of the surface region 102 (wherein the rest of the carrier 100 may be regarded for example as the third region 102c and the second region 102b of the carrier 100). Further, the first region 102a of the carrier 100 may be connected to the second region 102b of the carrier 100 via at least one support structure 108, e.g. via a single support structure 108, as shown in FIG. 1E, or via a plurality of support structures 108, as shown in FIG. 1F. There may be several possible modifications for connecting the first region 102a of the carrier 100 to the second region 102b of the carrier 100 via one or more support structures 108.

According to various embodiments, since the first region 102a of the carrier 100 may be held via the one or more support structures 108, the first region 102a may be separated into more than one sub-region via one or more trench structures 106, in analogy as described referring to FIGS. 1E and 1F, wherein each sub-region may be attached to the second region 102b of the carrier 100 via at least one support structure 108.

According to various embodiments, the hollow chamber 104 and the trench structure 106 may electrically separate (as well as spatially separate) the first region 102a of the carrier 100. Therefore, the first region 102a of the carrier 100 may be a silicon region on an insulator (the insulator may be in this case the spatial distance provided by the hollow chamber 104 and the electrically insulating support structure 108), which may be referred to as SOI or SOI-structure. Further, the first region 102a of the carrier 100 may be a silicon region on nothing (wherein nothing may be in this case the spatial distance provided by the hollow chamber 104), which may be referred to as SON or SON-structure. Referring to this, the hollow chamber 104 may be free of a solid material (except the material of the one or more support structures 108), e.g. the hollow chamber 104 may be or may include an empty space. Further, the trench structure 106 may be free of a solid material.

According to various embodiments, the inner walls of the hollow chamber 104 and/or the sidewalls of the one or more trenches of the trench structure 106 may be covered with an additional material, e.g. with an electrically insulating material, e.g. with an oxide, e.g. with silicon oxide. However, the hollow chamber 104 and/or the trench structure 106 may provide a gap between the first region 102a of the carrier 100 and the rest of the carrier. Illustratively, this gap may confine the first region 102a of the carrier 100 and may be interrupted (intermitted or bridged) only via the one or more support structures 108, or possibly (in one or more embodiments) additionally via the above-mentioned one or more lateral support structures of the trench structure 106 (not shown).

According to various embodiments, the hollow chamber 104 and/or the trench structure 106 may be completely filled or partially filled with an electrically insulating material, e.g. with silicon oxide, wherein the material may be deposited within the hollow chamber 104 and/or within the trench structure 106 via an ALD process or an LPCVD processes. This may allow providing an electrically insulating material surrounding the first region 102a of the carrier 100 without introducing mechanical stress or strain into the first region 102a. Other processes, as for example thermally oxidizing a support structure 108 and thereby providing for example a silicon oxide support structure 108 below the first region 102a of the carrier 100 may introduce mechanical stress or strain into the SOI-structure or SON-structure, since the silicon containing support structure 108 may expand during the oxidation process.

According to various embodiments, the one or more support structures 108 may consist of an oxide (e.g. silicon oxide) such that the support structures 108 may easily break if a sufficient high force is applied. The one or more support structures 108 may provide an attaching structure for attaching the first region 102a of the carrier 100 to the carrier, and at the same time, the one or more support structures 108 may provide a predefined breaking point, if the first region 102a is desired to be removed from the carrier.

According to various embodiments, the carrier 100 as described herein including the first region 102a being separated and/or electrically isolated from the carrier 100 via the hollow chamber 104, the at least one support structure 108 and optionally the trench structure 106, may provide a starting point for manufacturing an electronic device.

After the carrier 100 has been processed, as described herein, an electronic circuit (or a micro-electromechanical system, or a sensor, or any other component being processable in semiconductor technology) may be formed over and/or in the first region 102*a* of the carrier 100. In other words, a first electronic circuit (or a micro-electromechanical system, or a sensor, or any other component being processable in semiconductor technology) may be disposed over and/or in the first region 102*a* of the carrier 100. Further, a second electronic circuit (or a micro-electromechanical system, or a sensor, or any other component being processable in semiconductor technology) may be disposed over and/or in the third region 102*c* outside the trench structure 106 (or in the second region 102*b*). Thereby, the trench structure 106 may laterally isolate the first electronic circuit (or a micro-electromechanical system, or a sensor, or any other component being processable in semiconductor technology) from the second electronic circuit (or a micro-electromechanical system, or a sensor, or any other component being processable in semiconductor technology).

According to various embodiments, a separation (or separating a first region in the carrier) may include an electrical isolation (or providing an electrical isolation) such that no significant current flow may be possible between the separated structures. Further, a separation may include a spatial separation, e.g. by providing a gap or an empty space.

Figure 1G:
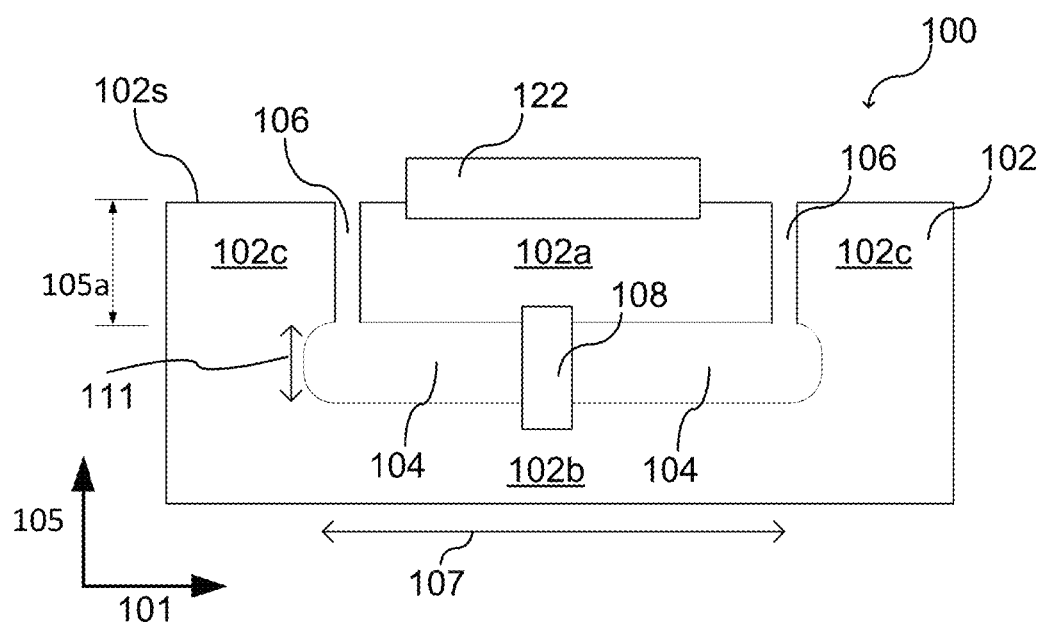

For several reasons, as illustrated in FIG. 1G, it may be desired to form one or more components 122 (e.g. electronic circuits or electronic components or mechanical components) over and/or in the first region 102*a* of the carrier 100, wherein the one or more components 122 may be separated from the rest of the carrier, since the one or more components 122 (e.g. including a sensor, a switch, a logic circuit, a microprocessor, a MEMS, and the like) have to be operated for example under specific operating conditions. A low voltage or low power component 122 may be for example integrated into a power device, e.g. into an IGBT, a power MOSFET, and the like, wherein the low voltage or low power component 122 may be separated (e.g. via the trench structure 106, the hollow chamber 104 and the support structure 108) from the power device being arranged in the rest of the carrier 100 (e.g. in the third region 102*c* and/or in the second region 102*b*.

Illustratively, the carrier 100 as described herein may allow providing a first electronic component and a second electronic component in a single carrier or in a single semiconductor substrate, wherein the two electronic components may need different operating conditions (e.g. operating voltages, operating currents, and the like), e.g. the carrier 100 may allow integrating a sensor (e.g. a temperature sensor) into a power electronic device to provide a direct measurement of the actual state of the power electronic device, integrating a current and/or voltage measurement structure into a power electronic device to determine the electronic properties of the power electronic device more accurately, and/or integrating a switch structure or a control circuit (e.g. a logic circuit) into a power electronic device to control the operation of the power electronic device.

According to various embodiments, a first electronic component (e.g. a sensor, a logic circuit, a switching circuit, a control circuit, and/or a measurement circuit) may be disposed or formed over and/or in the first region 102*a* of the carrier 100 and a second electronic component (e.g. a power electronic component, such as a diode, a bipolar junction transistor, an insulated gate bipolar transistor, a power MOSFET (a power metal oxide semiconductor (MOS) field-effect transistor (FET)), a thyristor, a gate turn-off thyristor, a MOS-controlled thyristor, an integrated gate-commutated thyristor (IGCT), and the like) may be disposed or formed over and/or in the third region 102*c* and/or second region 102*b* of the carrier 100. According to various embodiments, the second electronic component may be configured to operate at other operating conditions than the first electronic component, e.g. in a different voltage range and/or in a different current range. According to various embodiments, the second electronic component may be a semiconductor power component operating in a voltage range and/or current range being one or more orders of magnitude larger than the operating conditions of the first electronic component, e.g. the second electronic component may operate voltages in a range from about 50 V to about 5000 V and/or currents in the range from about 50 A to about 5000 A, wherein the first electronic component may be a logic circuit or a sensor working at voltages lower than about 50 V and/or currents lower than about 50 A. The first electronic component (e.g. a logic circuit, a switching circuit, a measurement circuit, and/or a temperature sensor) may not readily withstand voltages and/or currents typically operated by a power electronic component, wherein the first electronic component and the second electronic component may be arranged adjacent to each other in a single carrier, therefore, according to various embodiments, the first electronic component may be separated from the second electronic component via an electrically insulating structure being arranged in the carrier (e.g. via the hollow chamber 104, the trench structure 106, and the at least one support structure 108).

Further, according to various embodiments, the first electronic component may be electrically coupled to the second electronic component in order to analyze and/or control the second electronic component, e.g. via a metallization structure arranged over the carrier, wherein the first electronic component and the second electronic component may be at least partially formed in the carrier.

According to various embodiments, an electronic device may include a carrier 100 having a separated first region 102*a*, as described herein. The electronic device, as described herein, may provide an electronic control circuit being integrated into a power electronic component, the electronic control circuit may be configured to monitor and control the power electronic component such that the power electronic component may be designed according to other aspects, which may allow for example a smaller design obtaining the same properties as a common power electronic device and/or an enhanced functionality at the same size as a common power electronic device.

According to various embodiments, a high voltage device 122 may be integrated into the first region 102*a* of the carrier 100, wherein the high voltage device 122 may be vertically separated from the second region 102*b* of the carrier 100 via the hollow chamber 104, the at least one support structure 108 and optionally laterally separated from the third region 102*c* of the carrier 100 via the trench structure 106.

According to various embodiments, a micromechanical or micro-electromechanical device 122 may be integrated into the first region 102*a* of the carrier 100, wherein the micromechanical or micro-electromechanical device 122 may be vertically separated from the second region 102*b* of the carrier 100 via the hollow chamber 104, the at least one support structure 108 and optionally laterally separated from the third region 102*c* of the carrier 100 via the trench structure 106.

According to various embodiments, a sensor 122 or a sensor array 122 may be integrated into the first region 102a of the carrier 100, wherein the sensor or the sensor array may be vertically separated from the second region 102b of the carrier 100 via the hollow chamber 104, the at least one support structure 108 and optionally laterally separated from the third region 102c of the carrier 100 via the trench structure 106.

Figure 1H:
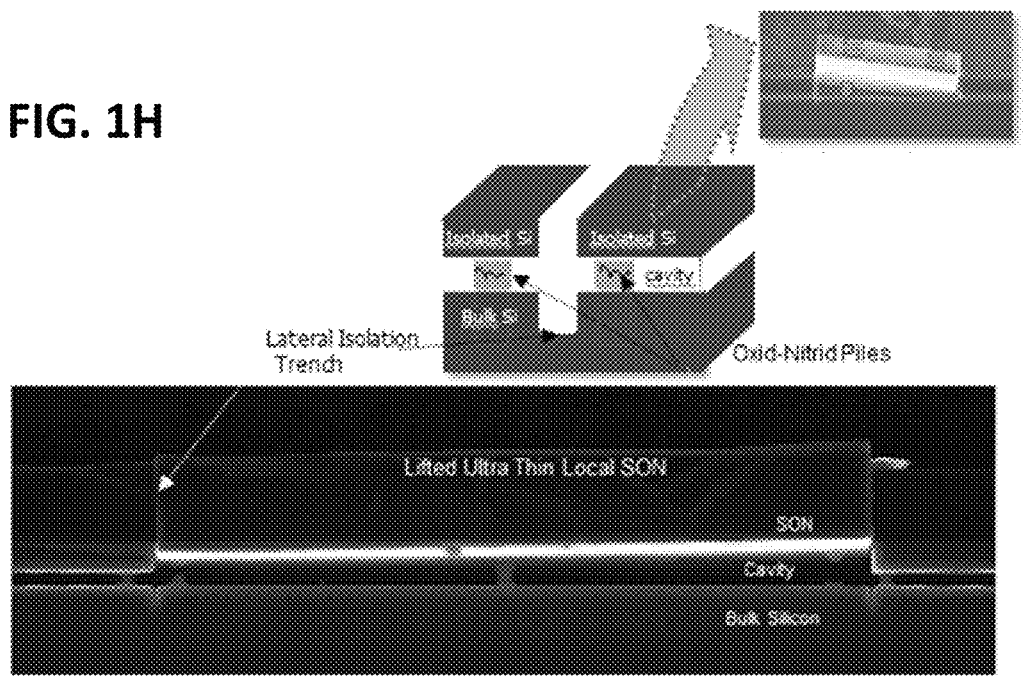
FIG. 1H shows scanning electron microscopy images (SEM-images) of a carrier and a schematic illustration of spatially removing a region of the carrier, according to various embodiments.

FIG. 1H illustrates a schematic view and a scanning electron microscopy image (SEM-image) of the carrier 100, e.g. after a plasma dicing has been performed to cut for example vertically through the first region 102a of the carrier 100 to remove at least a part of the first region 102a of the carrier 100. According to various embodiments, the first region 102a of the carrier 100 may be removed for example after an electronic circuit 122 has been formed in the first region 102a of the carrier 100, thereby providing for example an electronic circuit 122 on a thin or ultra-thin silicon region 102a or silicon carrier 102a. Removing the first region 102a from the carrier 100 may include breaking the one or more support structures 108 below the first region 102a in the hollow chamber 104. According to various embodiments, the second region 102b of the carrier 100 below the hollow chamber 104 (the cavity) may be regarded as or may be the bulk carrier 100. The first region 102a of the carrier 100 may be the SON, the silicon on nothing. As shown in FIG. 1H, the SON may be lifted from the bulk carrier 100, wherein the SON may have a thickness in the range smaller than about 50 µm, e.g. smaller than about 40 µm, e.g. smaller than about 30 µm, e.g. smaller than about 20 µm, e.g. smaller than about 10 µm, e.g. smaller than about 5 µm, e.g. smaller than about 1 µm. Therefore, the method for processing a carrier, as described herein, may include providing an ultra-thin carrier or an ultra-thin chip.

Various modifications and/or configurations of the carrier 100 and details referring to the hollow chamber 104 and the support structure 108 are described in the following, wherein the features and/or functionalities described referring to FIGS. 1A to 1H may be included analogously. Further, the features and/or functionalities described in the following may be included in the carrier 100 or may be combined with the carrier 100, as described before referring to FIGS. 1A to 1H.

Figure 2A:
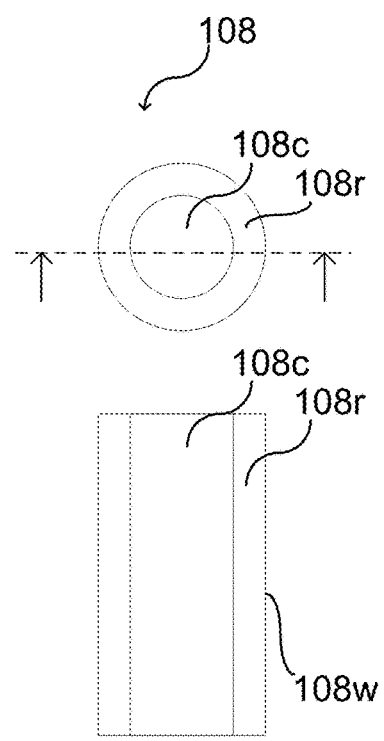
FIGS. 2A and 2B show respectively a schematic top view and a corresponding cross sectional view of a support structure, according to various embodiments.

FIG. 2A illustrates in the upper part a top view of a support structure 108, according to various embodiments, and in the lower part a corresponding cross sectional view of the support structure 108. According to various embodiments, the support structure 108 may have a cylindrical shape or may be a cylindrical structure, wherein the inner part 108c (the core) of the support structure 108 may be at least partially surrounded by a liner structure 108r. The liner structure 108r may at least laterally surround the core 108c, as shown in FIG. 2A. In analogy, the support structure 108 may include a prism (e.g. a right prism) having a polygonal base area (e.g. triangular, quadratic, hexagonal, octagonal, and the like).

Figure 2B:
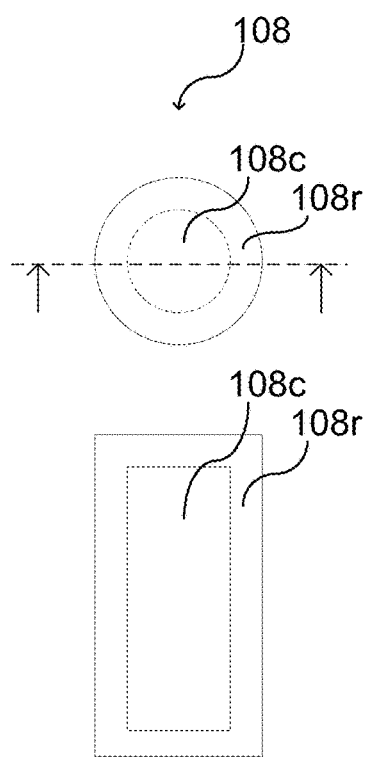

FIG. 2B illustrates in the upper part a top view of a support structure 108, according to various embodiments, and in the lower part a corresponding cross sectional view of the support structure 108, wherein the core 108c of the support structure 108 may be completely surrounded by the liner structure 108r.

Referring to FIGS. 2A and 2B, the core 108c of the support structure 108 and/or the liner structure 108r of the support structure 108 may include at least one material of the following group of materials: an electrically insulating material, an electrically insulating oxide, silicon oxide, a nitride, silicon nitride, an electrically insulating metal oxide, aluminum oxide, an electrically insulating metal nitride, an electrically insulating oxynitride, silicon oxynitride, an electrically insulating metal oxynitride, aluminum oxynitride, and the like.

In case, that the liner structure 108r does not completely cover or does not completely surround the core 108c of the support structure 108, as shown in FIG. 2A, the core 108c of the support structure 108 may include an electrically insulating material, such that the support structure 108 may electrically isolate the first region 102a of the carrier 100 above the hollow chamber 104 being supported by the support structure 108. Depending on the design of the support structure 108, the liner structure 108r and the core 108c of the support structure 108 may include electrically insulating material or may be configured to be electrically insulating.

In case the liner structure 108r completely covers or completely surrounds the core 108c of the support structure 108, as shown in FIG. 2B, the core 108c of the support structure 108 may not necessarily include an electrically insulating material. In this case, the liner structure 108r may be provided such that the support structure 108 may electrically isolate the first region 102a of the carrier 100 above the hollow chamber 104 being supported by the support structure 108. Therefore, the liner structure 108r may include an electrically insulating material or may consist of an electrically insulating material. The core 108c may include in this case, due to being surrounded by electrically insulating material, an arbitrarily selected material being processable in semiconductor technology, e.g. any metal, metal nitride, oxide, semiconducting material. Illustratively, the core 108c may provide in this case the mechanical stability of the support structure 108 and the liner structure 108r may electrically isolate the core 108c of the support structure 108.

According to various embodiments, the support structure 108 may include more than one, or more than two different regions, as illustrated herein, since there may be a variety of possibilities to provide support structures 108 in a similar way.

According to various embodiments, the support structure 108 may include a different material than the material surrounding (providing) the hollow chamber 104. The hollow chamber 104 may be for example an empty space in silicon, wherein the support structure 108 may include silicon oxide. The inner sidewall of the hollow chamber 104 may be for example oxidized or partially oxidized, after the hollow chamber 104 and the support structure 108 have been formed. In this case, the hollow chamber 104 may be partially filled with an oxide. Further, in the case that the trench structure 106 may be filled or partially filled with an electrically insulating material, as described before, the hollow chamber 104 may be partially filled as well, since the support structure 108 may be connected to the trench structure 106.

Figure 3:
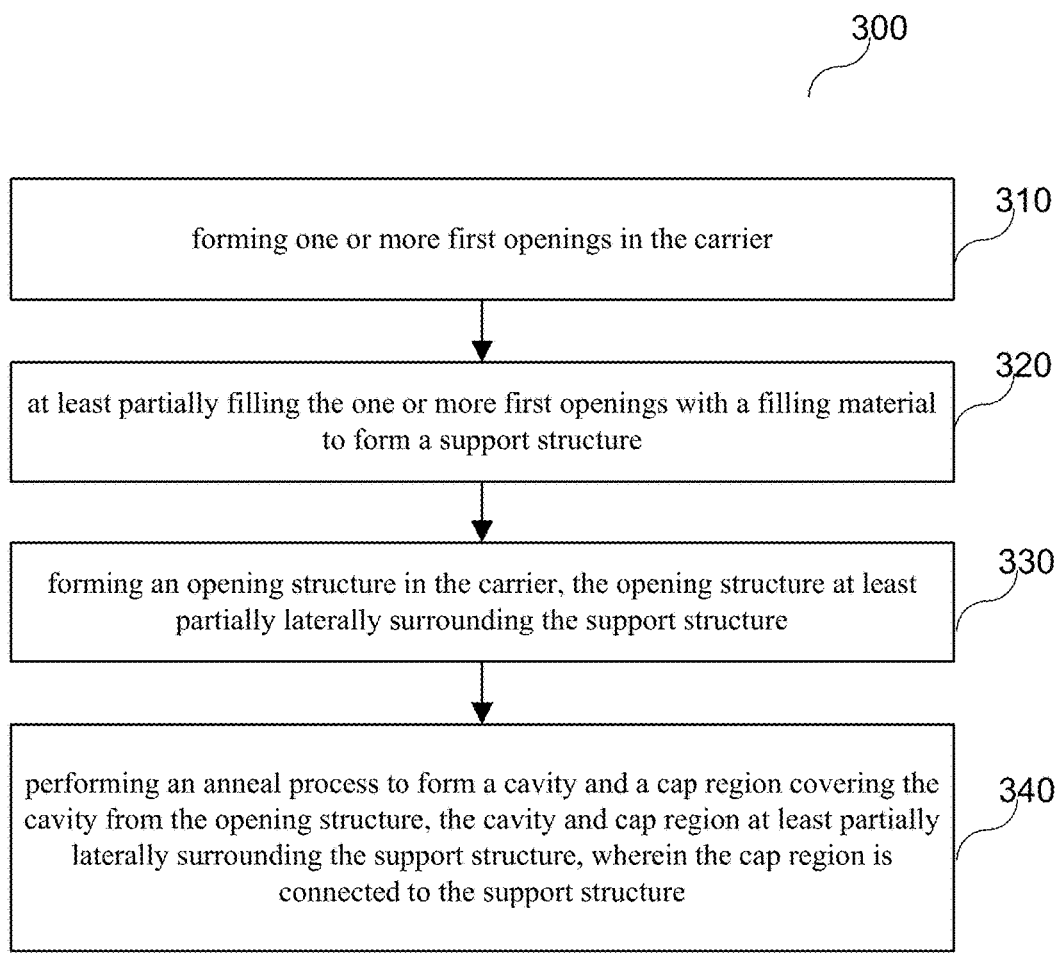
FIG. 3 shows a schematic flow diagram of a method for processing a carrier, according to various embodiments.

FIG. 3 shows a schematic flow diagram of a method 300 for processing a carrier, the method may include: in 310, forming one or more first openings in the carrier; in 320, at least partially filling the one or more first openings with a filling material to form at least one support structure; in 330, forming an opening structure in the carrier, the opening structure at least partially laterally surrounding the support structure; and, in 340, performing an anneal process to form a hollow chamber (cavity) and a cap region covering the hollow chamber (cavity) from the opening structure, the hollow chamber (cavity) and cap region at least partially laterally surrounding the at least one support structure, wherein the cap region is connected to the at least one support structure.

According to various embodiments, process 310 of forming one or more first openings in the carrier and process 320 of at least partially filling the one or more first openings with a filling material may provide at least one support structure 108, as described herein or for example similar as described referring to FIGS. 1A to 1G, 2A and 2B. According to various embodiments, process 330 of forming an opening structure in the carrier and process 340 of performing an anneal process may provide a hollow chamber 104 (a cavity 104) as described herein or for example similar as described referring to FIGS. 1A to 1G, 2A and 2B.

According to various embodiments, forming one or more first openings in the carrier may include performing a patterning process (e.g. a lithographic process and an etch process) of the surface of the carrier. Further, at least partially filling the one or more first openings with a filling material may include a layering process. According to various embodiments, forming an opening structure in the carrier may include forming a plurality of second openings, wherein forming an opening structure in the carrier may include a patterning process. According to various embodiments, the one or more first openings and the opening structure (one or more second openings) may be formed in a single patterning process. Further, the one or more first openings may be filled with the filling material before the anneal process is carried out.

Figure 4A:
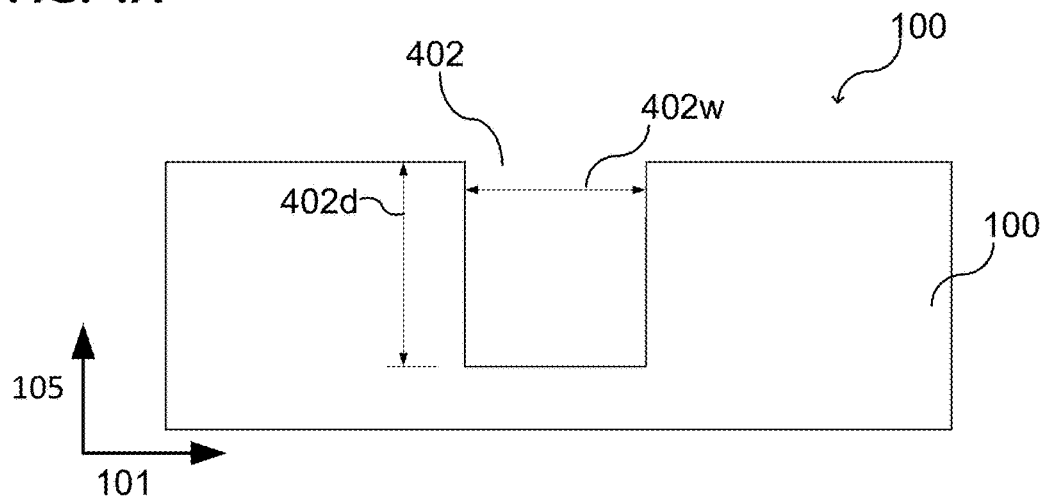
FIGS. 4A to 4C show respectively a schematic cross sectional view or a side view of a carrier during processing, according to various embodiments.

FIG. 4A shows a carrier 100 in a cross sectional view during processing, e.g. after one or more first openings 402 have been formed in the carrier 100 (one first opening is shown). The carrier 100 may be a silicon wafer, a silicon substrate or a carrier including silicon. The first opening (the one or more first openings 402) may have a width 402w in the range from about several tens of nanometers to about several tens of micrometers, e.g. a width in the range from about 30 nm to about 5 µm. Further, the first opening (the one or more first openings 402) may have a depth 402d in the range from about several tens of nanometers to about several micrometers, e.g. a depth in the range from about 30 nm to about 50 µm. Referring to this, the first opening (the one or more first openings 402) may have an aspect ratio (depth 402d/width 402w) in the range from about 2 to about 20.

According to various embodiments, the first opening (the one or more first openings 402) may be at least one of the following: a first recess (one or more first recesses 402), a first trench (one or more first trenches 402), a first hole (one or more first holes 402). The first opening (the one or more first openings 402) may extend substantially vertically into the carrier 100, wherein substantially vertically may include a deviation of about ±10°. However, the first opening (the one or more first openings 402) may extend obliquely into the carrier 100 under any desired angle. Thereby, the first opening (the one or more first openings 402) may extend into the carrier reaching the defined depth 402d.

According to various embodiments, the first opening (the one or more first openings 402) may have any processable shape, e.g. a prismatic shape, a cylindrical shape, or the like. According to various embodiments, the size, shape, and position of the first opening (the one or more first openings 402) may define the shape of the support structure 108 formed via the first opening (the one or more first openings 402). Therefore, the size, shape, and position of the first opening (the one or more first openings 402) may be adapted to provide the desired support structure 108, as described herein.

Figure 4B:
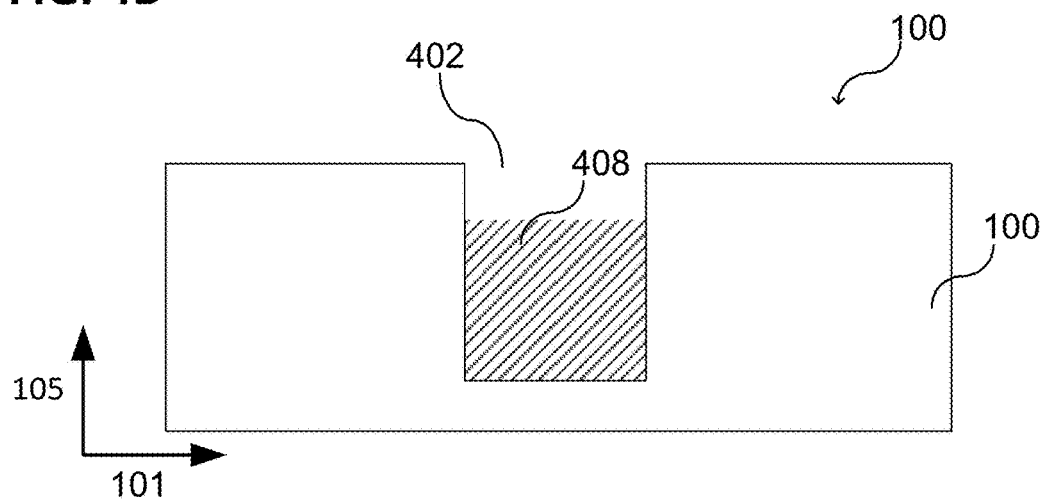

FIG. 4B shows the carrier 100 in a cross sectional view during processing, e.g. after the first opening (the one or more first openings 402) has been filled at least partially with a filling material 408. The filling material 408 may include or may be for example an electrically insulating material, e.g. an electrically insulating oxide, silicon oxide, a nitride, silicon nitride, an electrically insulating metal oxide, aluminum oxide, an electrically insulating metal nitride, an electrically insulating oxynitride, silicon oxynitride, an electrically insulating metal oxynitride, aluminum oxynitride, and the like, as already described for the support structure 108. Alternatively, the one or more first openings 402 may be completely filled with the filling material. Further, the one or more first openings 402 may be filled with more than one material providing the support structure 108, as described referring to FIGS. 2A and 2B.

Illustratively, the filling material 408 may provide the support structure 108 or a part of the support structure 108, such that the support structure 108 may be stable (e.g. in size, shape, and/or position) during a high temperature process, e.g. during an annealing at a temperature of larger than about 800° C., or e.g. larger than about 900° C., or e.g. larger than about 1000° C., or e.g. larger than about 1100° C.

According to various embodiments, before the one or more first openings 402 may be filled with the filling material, at least one sidewall or all sidewalls of the one or more first openings 402 may be covered with a liner material providing the liner structure 108r, as described before.

Figure 4C:
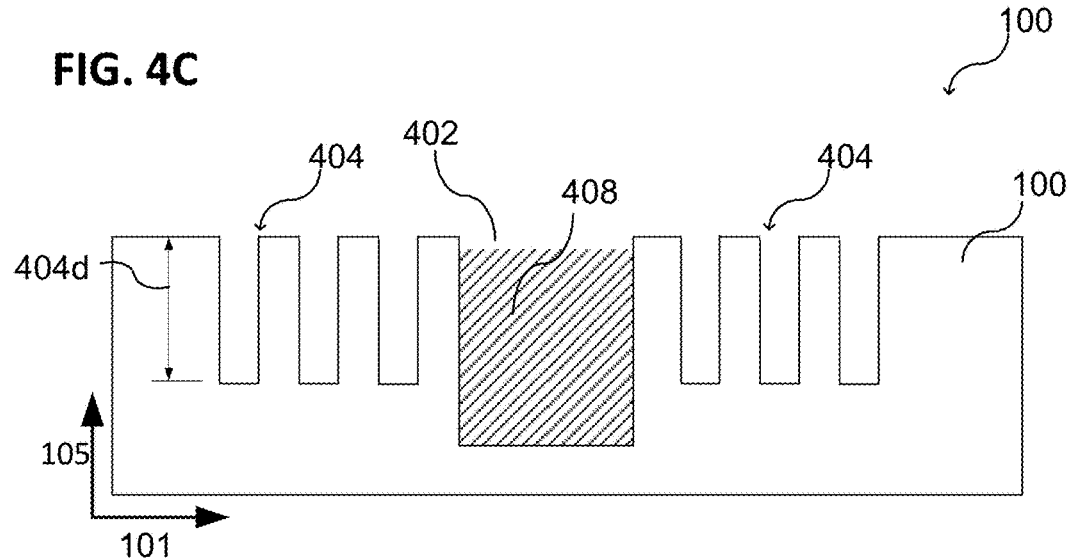
Figure 6A:
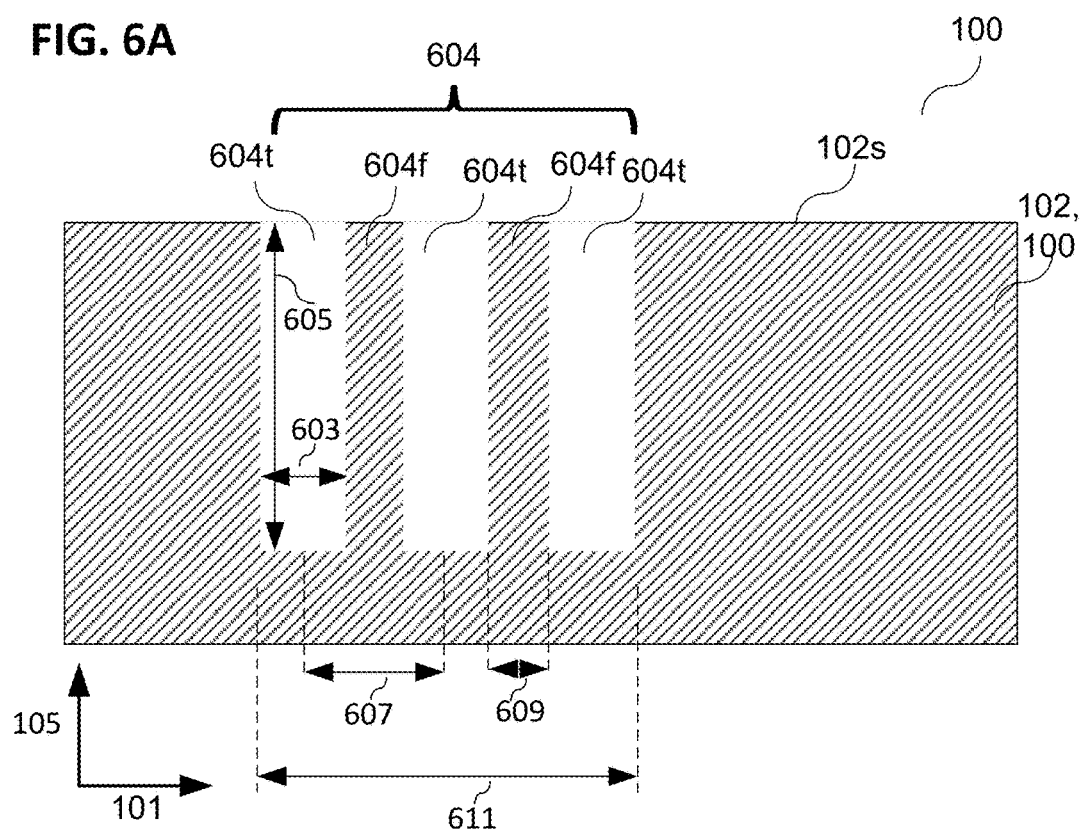
FIGS. 6A and 6B show respectively a schematic cross sectional view or a side view of a carrier during processing, according to various embodiments.
Figure 6B:
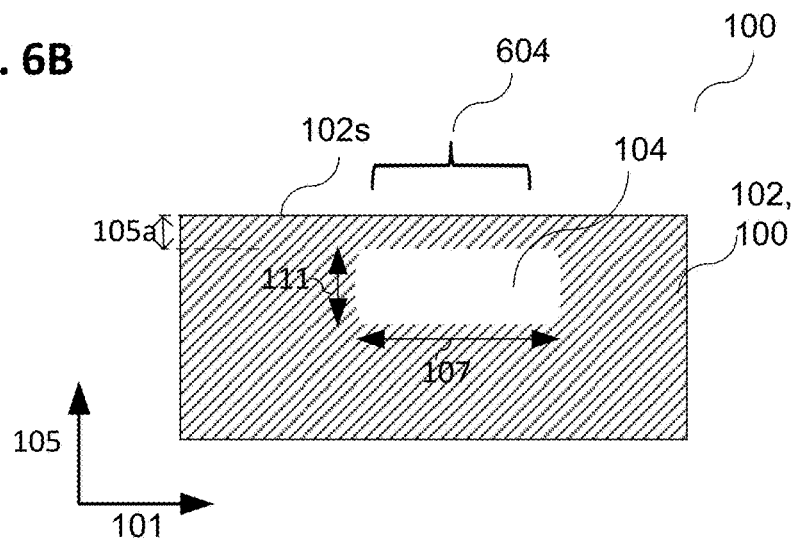

FIG. 4C shows the carrier 100 in a cross sectional view during processing, e.g. after the opening structure 404 (the one or more second openings 404) has been formed. The opening structure 404 may be formed such that the hollow chamber 104 may be formed after an annealing of the opening structure 404 has been carried out. Illustratively, the opening structure 404 may be the source structure for a venetia process for forming the hollow chamber 104. The opening structure 404 may include an arrangement of at least one of the following: recesses, holes, trenches, cavities, and the like (c.f. FIGS. 6A and 6B).

According to various embodiments, the opening structure 404 may laterally surround the first opening 402 or the one or more first openings 402. The depth 404d of the second openings of the opening structure 404 may be smaller than the depth 402d of the first opening 402.

Figure 4D:
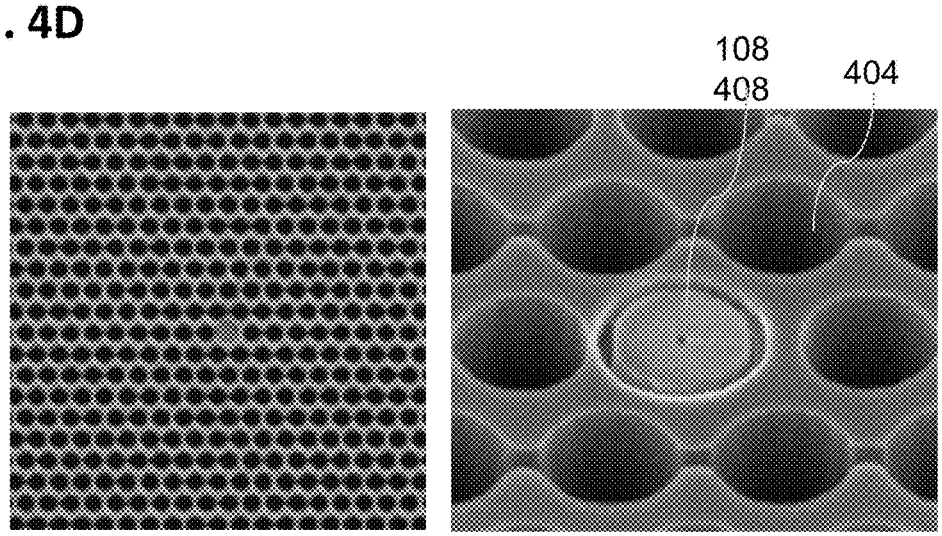
FIG. 4D shows scanning electron microscopy images of a carrier during processing of the carrier, according to various embodiments.

As illustrated in FIG. 4D in an SEM-image of the carrier 100 in a top view (left) and perspective view (right), the support structure 108, 408 may be formed within an opening structure 404. There may be a variety of modifications for providing the opening structure 404 and for providing the support structure 108 within the opening structure 404.

FIG. 4E shows the carrier 100 in a cross sectional view during processing, e.g. after an annealing has been carried out (c.f. FIG. 6B). The annealing of the opening structure 404 may form the hollow chamber 104 (venetia process). As already described, the hollow chamber 104 formed during the annealing may laterally surround the support structure 108, since the initial opening structure 404 may be provided laterally surrounding the filled first opening 402. After the annealing, depending on the depth 404d of the second opening of the opening structure 404 and the filling of the first opening, the support structure 108 may or may not protrude from the surface 102s of the carrier 100. During the annealing an SON-structure may be formed (e.g. due to diffusion and/or migration of material of the opening structure 404) providing a cavity 104 (the hollow chamber 104) and a cap region 102*a* (the first region 102*a* of the carrier 100) covering the cavity 104, the cavity 104 and cap region 102*a* at least partially laterally surrounding the support structure 108, wherein the cap region 102*a* is connected to the support structure. Illustratively, the cap region 102*a* may be stabilized during its formation (e.g. during the annealing), and after the cap region 102*a* has been formed, via the support structure 108; and, in case that the support structure 108 did not provide a stable structure during the annealing, the hollow chamber 104 would for example collapse during the annealing. Illustratively, providing the support structure 108 within the opening structure may allow forming a hollow chamber 104 within the carrier 100 having a larger lateral extension using the venetia process.

According to various embodiments, the surface 102*s* of the carrier 100 may be formed during the annealing. Further, as shown in FIG. 4F in a cross sectional view, the cap region 102*a* (the first region 102*a* of the carrier 100) may be enlarged, e.g. covered with an additional material layer 402, e.g. an epitaxial silicon layer. According to various embodiments, the cap region 102*a* and the additional material layer 402 formed over the cap region 102*a* may provide the first region 102*a* of the carrier 100 above the hollow chamber 104, as already described. Forming an additional material layer 402 over the cap region 102*a* may provide a new surface 102*s* of the carrier 100.

Depending on the formation of the hollow chamber 104, forming an additional material layer 402 over the cap region 102*a* may be optional.

As illustrated in FIG. 4G in an SEM-image of the carrier 100 in a perspective view (left) and a cross sectional view (right), the one or more support structures 108 may be disposed within the hollow chamber 104 (cavity 104). The hollow chamber 104 may laterally extend below the surface of the carrier 100 (spaced apart from the surface), thereby providing a silicon on nothing structure 102*a*.

Various modifications and/or configurations of the method for processing a carrier are described in the following, wherein the features and/or functionalities already described referring to FIGS. 4A to 4G may be included analogously. Further, the features and/or functionalities described in the following may be included in the method for processing a carrier, as described before referring to FIGS. 4A to 4G.

Figure 5A:
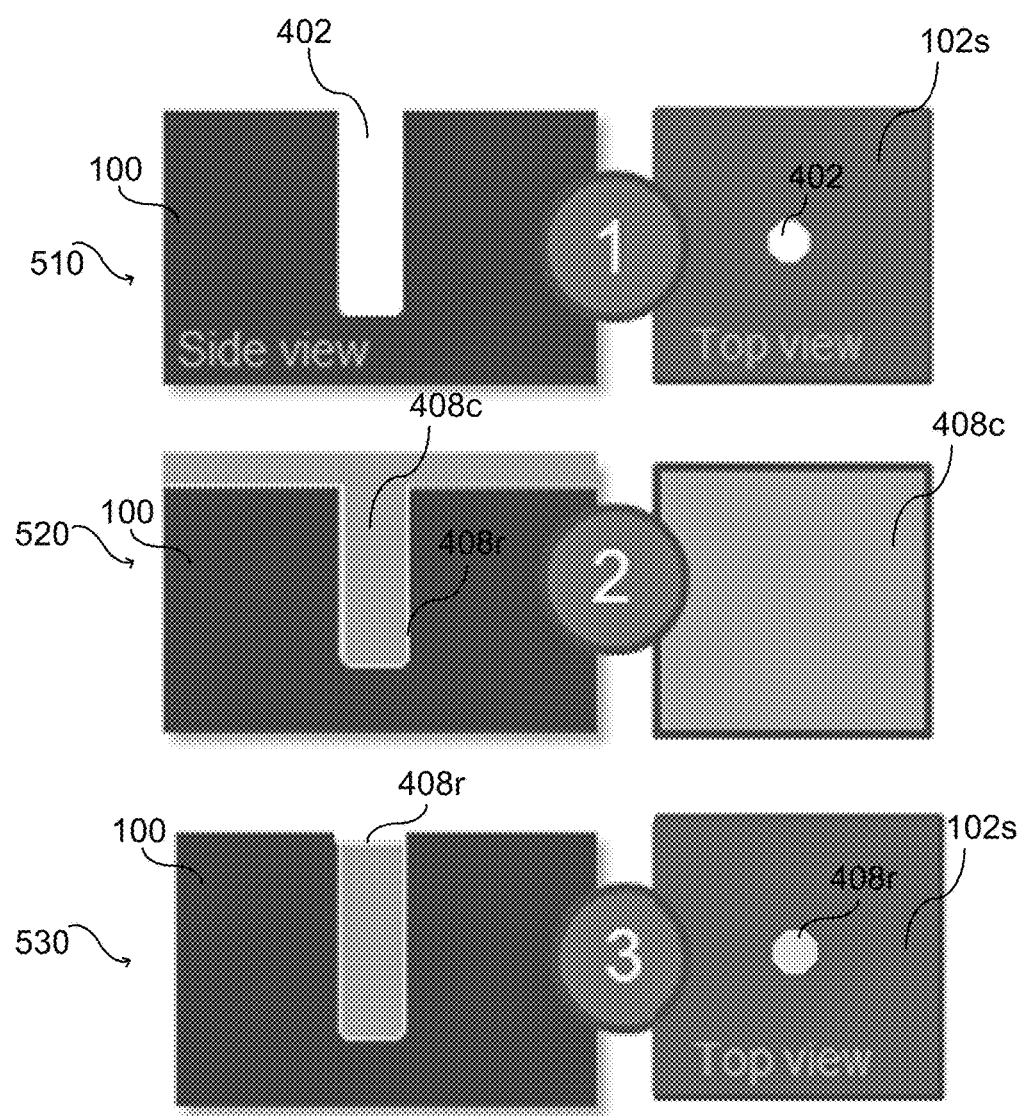
FIGS. 5A and 5B show respectively a schematic cross sectional view and a corresponding top view of a carrier after six processing stages during processing, according to various embodiments.
Figure 5B:
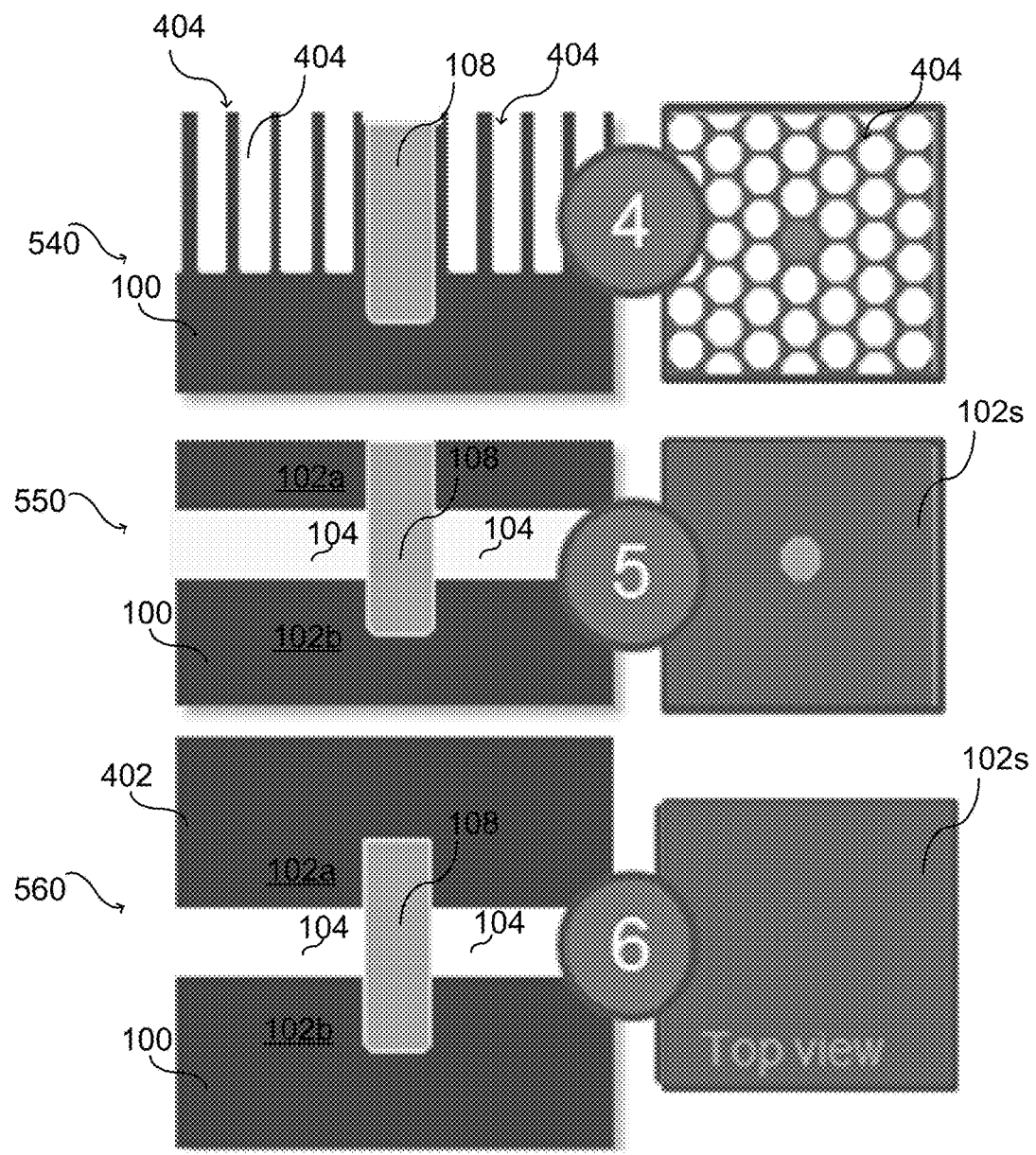

In FIG. 5A and FIG. 5B a schematic process flow of a method for processing a carrier is illustrated in a cross sectional view (left) and a top view (right). The numbering may illustrate a possible processing sequence.

Firstly, in 510, a first opening 402 may be formed within the carrier 100. The first opening 402 may be etched into the carrier 100 (e.g. by forming a patterned mask layer over the carrier 100 and partially etching the carrier, thereby forming the first opening 402). Subsequently, in 520, a liner layer 408*r* (providing the liner structure 108*r* of the support structure 108) may be formed over the carrier 100 covering at least the inner sidewalls of the first opening 402. The liner layer may be formed by applying a conformal deposition process. After the liner layer 408*r* has been formed, a core material layer 408*c* may be formed over the carrier, covering the liner layer 408*r* (providing the core 108*c* of the support structure 108). In the case, that the liner layer consists of an electrically insulating material, the core material may include polysilicon.

Subsequently, in 530, the core material layer 408*c* and the liner layer 408*r* may be partially removed exposing the upper surface 102*s* of the carrier 100. Afterwards, the remaining core material in the first opening may be covered with liner material, for example to completely surround the core 108*c* of the support structure 108 with the liner structure 108*r*. According to various embodiments, the carrier 100 may be subjected to one or more CMP processes for partially removing the liner layer and the core material.

According to various embodiments, after processes 510, 520, and 530 have been carried out, a support structure 108 may be obtained within the carrier 100 as a result.

Secondly, as shown in FIG. 5B, in 540, the opening structure 404 (the venetia trench arrangement) may be formed in the carrier next to and laterally surrounding the support structure 108. As shown in the top view, the opening structure 404 may include a plurality of holes (e.g. of prismatic shape) being arranged in a hexagonal lattice. According to various embodiments, the opening structure 404 may be formed by applying a patterning process, as already described. Alternatively, other designs may be possible for an opening structure for a venetia process.

The opening structure 404 may be formed in the very same patterning process as the first opening 402. In this case, the opening structure 404 may be covered while filling the first opening 402. In this case, the first opening 402 may be an opening of the plurality of openings of the opening structure 404.

Subsequently, in 550, an annealing process may be performed, wherein the opening structure 404 may be subjected to a heat treatment in a hydrogen containing atmosphere. Thereby, the hollow chamber 104, the so-called cavity or buried cavity, is formed from the opening structure 404. Forming the hollow chamber 104 may lead to the formation of the cap region 102*a* (the first region 102*a* of the carrier 100) above the hollow chamber 104, wherein the cap region 102*a* may be supported (carried, held) by the support structure 108.

Subsequently, in 560, an epitaxially grown silicon layer 402 may be formed over the cap region 102*a*, e.g. using LPCVD or ALD. Thereby, the silicon region 102*a* over the hollow chamber 104 may be enlarged to the desired thickness.

After the processes 510 to 560 have been carried out, a carrier 100 may be provided, as described before. The surface 102*s* of the carrier 100 may be a silicon surface being ready to be further processed in semiconductor technology. Optionally, the carrier 100 may be ready for further processing (e.g. for forming an electronic circuit over and/or in the cap region 102*a*.

According to various embodiments, in the following FIGS. 6A and 6B details may be provided and/or illustrated for a process of forming a hollow chamber 104 in the carrier 100. This process may be used to form a hollow chamber 104 in the carrier separating a cap region 102*a* from the carrier 100 (e.g. separating a first region 102*a* from a second region 102*b* of the carrier 100).

According to various embodiments, forming the hollow chamber 104 within the carrier 100 may include: forming an opening structure 604 in the carrier 100, the opening structure 604 may include one or more second openings 604*t*, each of the one or more second openings 604*t* extending from the surface 102*s* of the carrier 100; and performing an anneal process such that the hollow chamber 104 is formed in the carrier 100 from the opening structure 604. As already shown, the opening structure 604 may be arranged next to the support structure 108 in the carrier 100, wherein one or more of the opening structures 604 may laterally surround the support structure 108. In other words, the opening structure 404, as described herein, may include one or more of the opening structures 604 illustrated in FIG. 6A, wherein the one or more of the opening structures 604 may laterally surround or at least partially laterally surround the support structure 108 or one or more support structures 108. Therefore, the hollow chamber 104 formed from the one or more opening structures 604 may laterally surround the hollow chamber 104 after the annealing has been carried out.

In other words, a method for processing a carrier may include: forming at least one opening structure 604 at least one of over and in a first region 102 of the carrier 100; and subsequently annealing the at least one opening structure 604 such that one or more hollow chambers 104 may be formed by material of the at least one opening structure 604 (such a processing of the carrier may be also referred to as venetia process). According to various embodiments, a plurality of hollow chambers 104 may be formed in the carrier 100 providing a plurality of first regions 102a being separated from the rest of the carrier 100. According to various embodiments, the one or more hollow chambers 104 may be a continuous single hollow chamber, wherein one or more support structures 108 may be arranged within the continuous single hollow chamber carrying the cap region 102a over the continuous single hollow chamber.

As schematically illustrated in FIG. 6A, according to various embodiments, the opening structure 604 may include one or more second openings 604t (e.g. recesses or holes) formed in the carrier 100. According to various embodiments, the same opening structure 604 may be formed by patterning a previously deposited surface layer 102, e.g. by forming one or more structure elements 604f at least one of over and in the carrier 100.

The carrier 100 may be a silicon wafer 100 or a silicon substrate 100, as already described. The carrier 100 may be an arbitrary type of carrier, as already described, including a carrier surface layer 102, wherein the carrier surface layer 102 may be a silicon layer 102. The process of forming the opening structure 604 in a carrier 100, as described herein, may be applied in analogy to a carrier 100 having a silicon surface 102 layer, which may be not described in more detail for sake of brevity.

A process for forming at least one opening structure 604 at least one of over and in the carrier 100 may include patterning the carrier 100. Therefore, a patterned mask layer may be disposed over the carrier 100, wherein the patterned mask layer may at least partially cover the carrier 100 and may expose at least one region to be etched of the carrier 100, and subsequently carrier material may be partially removed from the at least one exposed region of the carrier 100 to form at least one opening structure 604 in the carrier 100.

According to various embodiments, the shape, the size, the positions, and the number of second openings 604t included in the opening structure 604 may be selected in accordance with the desired shape of the hollow chamber 104 to be formed in the carrier 100. The shape, the size, the positions, and the number of opening structures 604 may be selected in accordance with the desired shape, size, positions, and number of hollow chambers 104 to be formed in the carrier 100.

According to various embodiments, at least one etch process may be applied to partially remove the respective carrier material to provide the at least one opening structure 604, wherein the least one etch process may include a dry etch process, e.g. reactive ion etching, e.g. deep reactive ion etching. A reactive etch process, as described herein, may include at least one of the following etch chemistries: $SF_6$, $O_2$, HBr, $NF_3$, $C_4F_8$, and $C_4F_6$. The etch process may be selective to the carrier material, e.g. selective to silicon, such that a patterned mask layer may be utilized to remove the carrier material partially at the desired positions, and therefore, forming at least one opening structure 604 at the desired position. The second openings 604t of the opening structure 604 may be surrounded by carrier material (silicon). The second openings 604t included in the at least one opening structure 604 may have an aspect ratio (the ratio of the depth 605 of the second opening 604t to the width 603 of the second opening 604t), in the range from about 2 to about 30, e.g. in the range from about 2 to about 20, e.g. in the range from about 2 to about 10.

As shown in FIG. 6A, a plurality of second openings 604t (recesses, trenches, holes) may be formed in carrier 100. The plurality of second openings 604t may represent the opening structure 604. Each second opening 604t of the plurality of second openings may have a rectangular shape or a quadratic shape in the cross sectional view as illustrated in FIG. 6A. The base area of a second opening 604t included in the at least one opening structure 604, e.g. seen from the top, may have the shape as defined by the patterned mask layer, e.g. a rectangular shape, a quadratic shape, a polygonal shape, a circular shape or an elliptic shape. A second opening 604t may have the form (or shape) of a right prism, e.g. a cube, a cuboid, a cylinder and the like.

As shown in the cross sectional view in FIG. 6A, at least one second opening 604t of the plurality of second openings 604t, e.g. all openings of the plurality of second openings 604t, may have a depth 605 in the range from about 1 µm to about 100 µm, e.g. in the range from about 1 µm to about 50 µm. According to various embodiments, at least one second opening 604t of the plurality of second openings 604t, e.g. all openings of the plurality of second openings 604t, may have a width 603 (or in the case of cylindrical shapes a diameter 603) in the range from about 0.1 µm to about 50 µm, e.g. in the range from about 0.2 µm to about 20 µm, e.g. in the range from about 0.5 µm to about 5 µm. According to various embodiments, the distance 607 between two adjacent second openings 604t of the opening structure 604, measured from the center of one of the two adjacent second openings to the center of the other one of the two adjacent second openings, may be in the range from about 0.2 µm to about 100 µm. Therefore, according to various embodiments, the width 609 of the remaining carrier material 604f between respectively two adjacent second openings 604t of the opening structure 604t may be, as a result of the width 603 and the distance 607, in the range from about 0.1 µm to about 100 µm.

According to various embodiments, the depth 605 of a second opening 604t of the opening structure 604 may define or may influence the depth position (e.g. the depth 105a) of the respective hollow chamber 104 formed from the opening structure 604, e.g. in a subsequently performed annealing process or heat treatment (c.f. FIG. 6B). The aspect ratio of a second opening 604t of the opening structure 604 may define or may influence the size of the respective hollow chamber 104 formed from the second openings 604t, e.g. in a subsequently performed annealing process. In summary, the arrangement of the one or more second openings 604t in the opening structure 604 (or the arrangement of more than one opening structures 604 in the carrier 100) may determine and/or influence the arrangement of the one or more hollow chambers 104 generated in the carrier 100, e.g. the one or more hollow chambers 104 may be formed from the opening structure 604 during a subsequently performed annealing process. According to various embodiments, the width 107 of the hollow chamber 104 may be defined by the width 611 of the opening structure 604.

According to various embodiments, the at least one opening structure 604 may include one second opening or more than one second opening 604t, e.g. any other number of openings, e.g. two, three, four, five, six, seven, eight, nine, ten, or even more than ten, or more than 20 or even hundreds of second openings 604t, depending on the desired number, shape and/or size of hollow chambers 104 to be formed.

An annealing process may be carried out after the opening structure 604 has been formed. As illustrated in FIG. 6B, at least one (one or more) hollow chamber 104 may be formed during the annealing of the opening structure 604 is carried out, e.g. due to the migration of material of the at least one opening structure 604, e.g. due to the migration of silicon 604f surrounding the second openings 604t. The migration of material of the opening structure 604 may form one or more hollow chambers 104 in the carrier 100 separating a first region 102a of the carrier 100. According to various embodiments, the lateral extension 107 of the one or more hollow chambers 104 may be in a range from about several hundreds of nanometers up to several micrometers or even up to several hundreds of micrometers.

According to various embodiments, the thickness 105a of the cap region covering the at least one hollow chamber 104 or thickness 105a of the material region 102a (the isolated region 102a) above the at least one hollow chamber 104 may be in the range from about 0.2 µm to about 100 µm. The cap region 102a or the material region 102a covering the at least one hollow chamber 104 may include silicon (e.g. doped silicon). Further, the carrier 100 may form a new surface 102s during the annealing of the opening structure 604.

According to various embodiments, the annealing process being utilized for forming the one or more hollow chambers 104 from the opening structure 604 may cause at least one of migration, diffusion, material transport, and material rearrangement of the material surrounding the one or more second openings 604t included in the opening structure 604 while forming the one or more hollow chambers 104.

According to various embodiments, the annealing process being utilized to form the one or more hollow chambers 104 from the opening structure 604 may be performed using temperatures in the range from about 800° C. to about 1400° C., e.g. in the range from about 900° C. to about 1300° C., e.g. in the range from about 1100° C. to about 1200° C. According to various embodiments, the duration of the annealing process may be at least in the range from about several minutes, e.g. larger than 5 min, e.g. larger than 10 min, e.g. larger than 20 min. According to various embodiments, the annealing process may be carried out under vacuum conditions. According to various embodiments, the annealing process may be carried out in the absence of a significant oxygen amount (or oxygen partial pressure), e.g. in nitrogen atmosphere, e.g. in an argon atmosphere, e.g. in a chemical reducing atmosphere including nitrogen and hydrogen (e.g. a mixture of nitrogen with 2% to 20% hydrogen (substance amount fraction)), e.g. in a chemically reducing atmosphere including argon and hydrogen (e.g. a mixture of argon with 2% to 20% hydrogen (substance amount fraction)).

According to various embodiments, one or more hollow chambers 104 may also be referred to as empty space in silicon and the first region 102a over a hollow chamber 104 may be referred to as silicon on nothing (SON) structure or migrated silicon region. Illustratively, since the empty space may be electrically isolating, the first region 102a over a hollow chamber 104 may be referred to as silicon on insulator (SOI) structure. The migrated silicon region may have a first thickness after the annealing process, wherein additional material may be deposited over the annealed carrier increasing the thickness of the isolated region 102a over the one or more hollow chambers 104.

According to various embodiments, the size and/or the shape of the one or more hollow chambers 104, the thickness of the migrated silicon region 102a, and the position of the one or more hollow chambers 104 may be controlled and/or influenced by the design of the opening structure 604, and therefore, by patterning the carrier 100, which may be performed using processes of semiconductor industry, as described herein. The one or more hollow chambers 104 may be surrounded by silicon, e.g. completely surrounded by silicon. In other words, the one or more hollow chambers 104 may not have an opening to a surface of the carrier 100 after being formed via the annealing process.

According to various embodiments, the size, the shape, and the position of the one or more hollow chambers 104 may not significantly change or vary in a further heat treatment. According to various embodiments, the one or more hollow chambers 104 may be stable in size, shape, and/or position up to temperatures of about 1300° C. According to various embodiments, the one or more hollow chambers 104 may provide a stable electrically insulating structure 104 in a carrier, wherein the carrier may be processed at high temperatures, as for example typical high temperature processes included in manufacturing an integrated circuit, e.g. in manufacturing a CMOS-structure, e.g. in manufacturing a power semiconductor device, e.g. in manufacturing a transistor, e.g. in manufacturing a photo sensor, and for example in manufacturing a micro electromechanical system.

Figure 7:
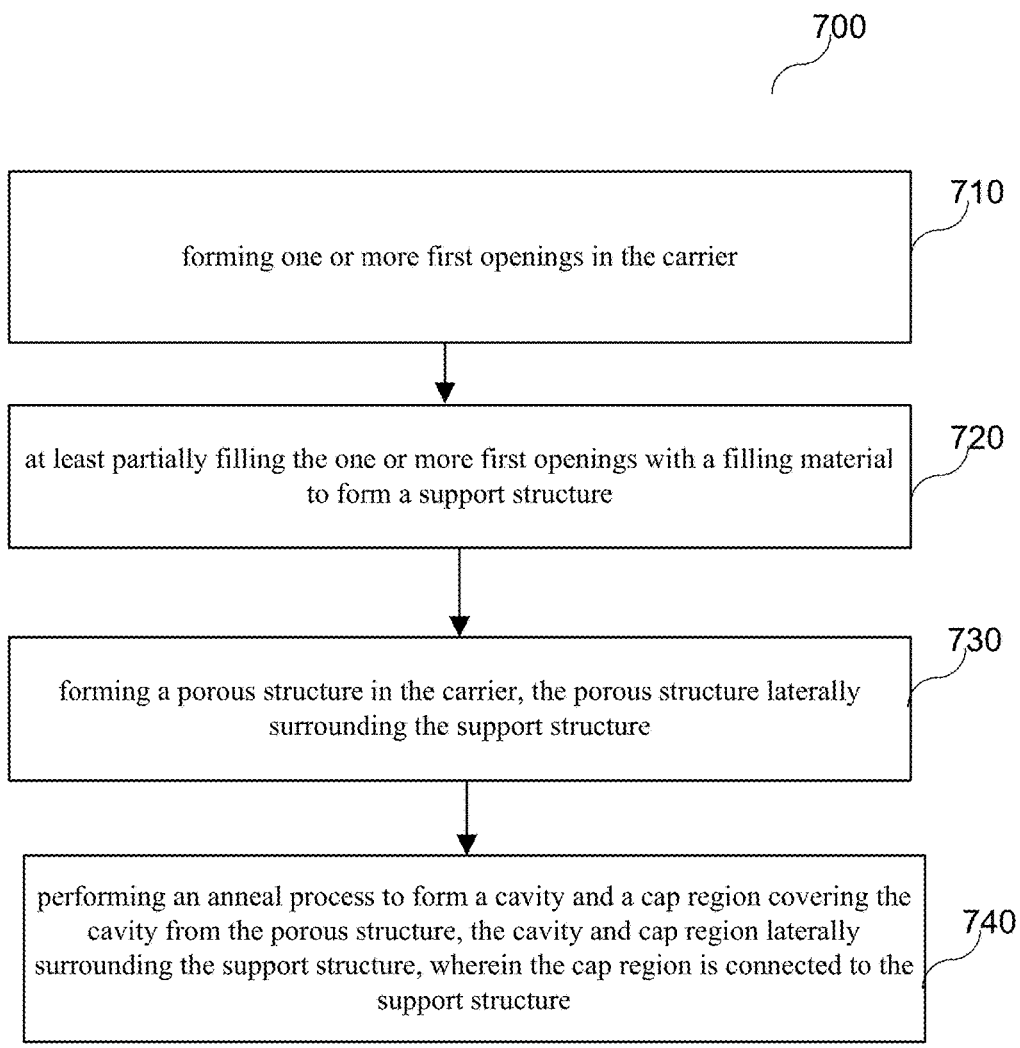
FIG. 7 shows a schematic flow diagram of a method for processing a carrier, according to various embodiments.

FIG. 7 shows a schematic flow diagram of a method 700 for processing a carrier 100, the method may include: in 710, forming one or more first openings in the carrier; in 720, at least partially filling the one or more first openings with a filling material to form a support structure; in 730, forming a porous structure in the carrier, the porous structure laterally surrounding the support structure; and, in 740, performing an anneal process to form a cavity (hollow chamber) and a cap region covering the cavity from the porous structure, the cavity and cap region laterally surrounding the support structure, wherein the cap region is connected to the support structure.

Illustratively, the hollow chamber 104 may be formed from a porous structure instead of from an opening structure 404, 604, as described before.

Figure 8A:
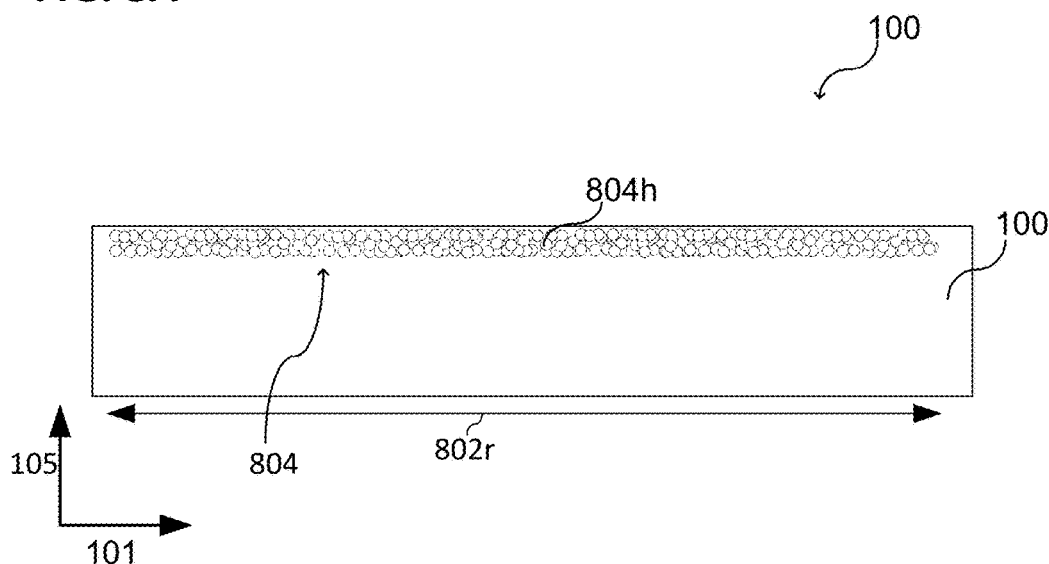
FIGS. 8A to 8C show respectively a schematic cross sectional view or a side view of a carrier during processing, according to various embodiments.
Figure 8B:
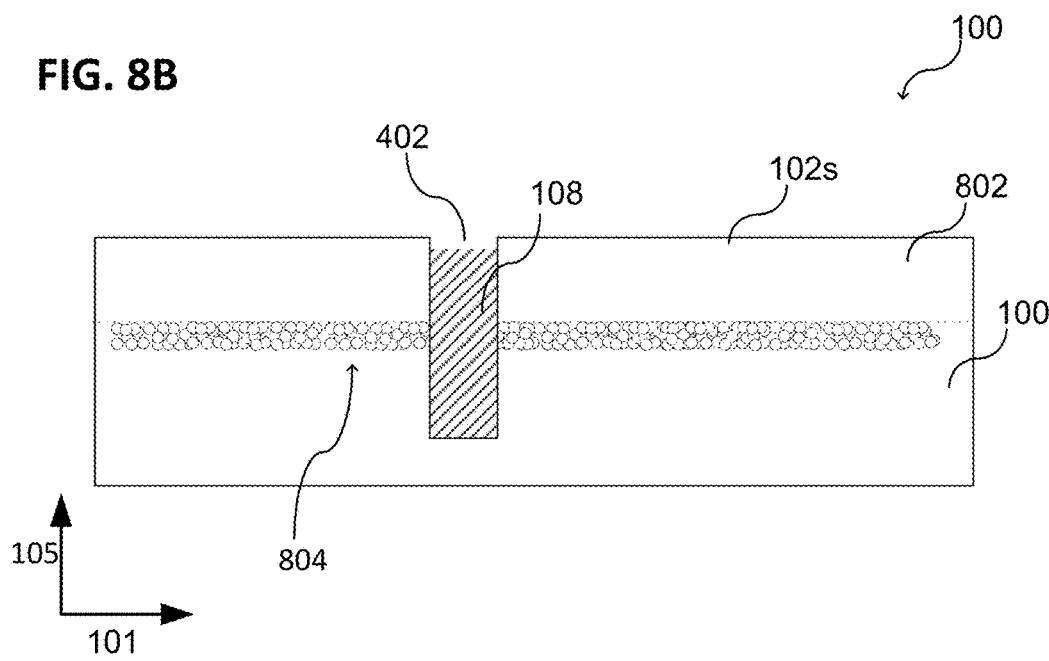
Figure 8C:
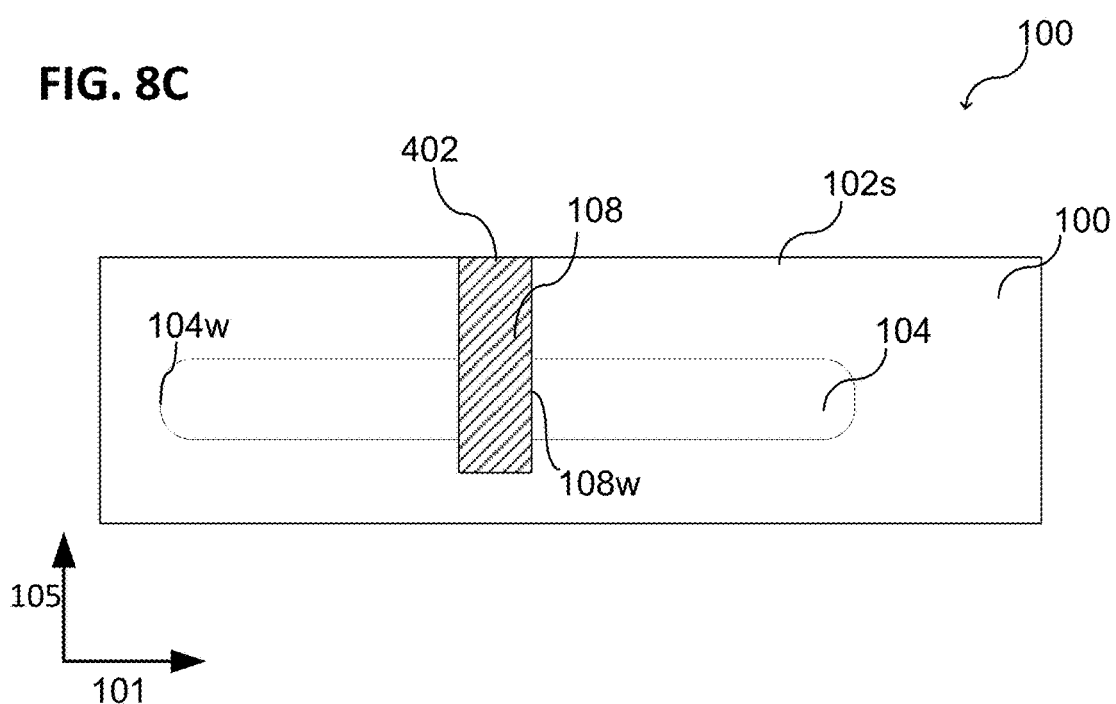

According to various embodiments, as illustrated in FIGS. 8A to 8C, forming a hollow chamber 104 in the carrier 100 may include: forming a porous structure 804 at least one of over and in the carrier 100, the porous structure 804 including a plurality of pores 804h in the carrier material of the carrier 100; and forming a cover layer 802 over the carrier 100, the cover layer 802 covering the porous structure 804. According to various embodiments, the porous structure 804 may include one or more porous regions. According to various embodiments, the opening structure 404, as described before, may include one or more porous regions 804. Further, the hollow chamber 104 may be formed from the porous structure 804 covered with the cover layer 802 by performing an anneal process, such that the plurality of pores 804h may form a continuous hollow chamber 104, as described before. According to various embodiments, the cover layer 802 may provide the surface region 102s of the carrier 100 after the annealing. Further, the cover layer 802 may be a part of the carrier 100.

According to various embodiments, FIG. 8A shows a carrier after a porous structure 804 has been formed in the carrier 100, the porous structure 804 may include a plurality of pores 804h (e.g. voids being surrounded by carrier material of the carrier 100). According to various embodiments, the porous structure 804 may be formed by processing a selected region 802r of the carrier 100, wherein the carrier 100 may be for example a silicon substrate. The selected region 802r may be defined (or the region 802r of the carrier 100 may be selected) by applying a mask material layer and patterning the mask material layer subsequently, such that a selected region 802r of the carrier 100 may be exposed. In other words, the selected region 802r may be defined by a patterned mask layer being arranged over the surface 102s of the carrier 100.

The selected region 802r may be subsequently subjected to a physical and/or chemical treatment (e.g. a pore formation treatment) to provide a porous structure 804 in a defined region of the carrier 100. As described herein, the term "porosity" or related terms like "porous" structure, and the like, may be defined as the fraction of voids within the material. For example, porous silicon may be divided into three categories based on the size of the pores included in the silicon: firstly, micro-porous silicon including pores having a diameter smaller than about 2 nm, secondly, meso-porous silicon including pores having a diameter in the range from about 2 nm to about 50 nm, and, thirdly, macro-porous silicon including pores having a diameter larger than about 50 nm.

Therefore, forming a porous structure 804 in a selected region 802r of the carrier 100 may include partially treating a silicon substrate 100 such that at least one porous region is formed in the silicon substrate 100 including at least one of macro-porous silicon, meso-porous silicon, and micro-porous silicon. According to various embodiments, forming a porous structure 804 in a selected region 802r of the carrier 100 may include introducing a plurality of pores 804h into the silicon substrate 100, the plurality of pores 804h forming the porous structure 804 in a selected region 802r of the carrier 100, e.g. by using an anodization process (e.g. performed in an anodization cell). An anodization cell may for example include a platinum cathode and a silicon carrier 100 being configured as anode in presence of an electrolyte, e.g. hydrogen fluoride ($HF_{aq}$) electrolyte. Thereby, the corrosion of the silicon substrate may be generated by applying a voltage between the platinum cathode and the silicon substrate and running electrical current through the anodization cell.

According to various embodiments, forming a porous silicon region in the carrier 100 by utilizing an anodization process may enable to generate a porosity of porous silicon in the range from about 5% to about 90%. Further, the electrolyte being used in the anodization cell may include ethanol.

Further, according to various embodiments, forming a porous structure 804 in the selected region 802r of the carrier 100 may include introducing a plurality of pores 804h into the silicon substrate 100 by using stain etching or a so-called stain etch process.

A stain etch process may include performing a wet etch process using a stain-etchant, e.g. at least one of hydrofluoric acid, nitric acid and water, e.g. an etchant including hydrofluoric acid, nitric acid and water (e.g. a diluted solution of nitric acid in concentrated hydrofluoric acid). According to various embodiments, a porous silicon structure 804 may be formed by stain-etching, e.g. by subjecting an exposed region 802r of the silicon substrate 100 to a wet etchant including nitric acid ($HNO_3$) and hydrogen fluoride (HF).

After one or more porous structures 804 have been formed in the carrier 100, as shown in FIG. 8A, a cover layer 802 may be formed over the carrier 100; the cover layer 102 may cover the porous structure 804 completely. According to various embodiments, the cover layer 102 being formed over the surface of the carrier 100 may include silicon, wherein the carrier 100 may include silicon as well, therefore, a buried porous structure 804 may be formed within the carrier 100, as illustrated in FIG. 8B. According to various embodiments, the cover layer 102 may be regarded as providing a part of a surface region 102 of the carrier 100.

After the porous structure 804 has been formed in the carrier 100, the support structure 108 may be formed into the carrier 100, similarly as described before. The support structure 108 may be formed through the porous structure 804 such that the porous structure 804 may laterally surround the support structure 108. Alternatively, the support structure 108 may be formed before the porous structure 804 is formed, wherein the porous structure 804 may be formed next to the support structure 108.

Subsequently, according to various embodiments, a heat treatment (annealing) may be carried out such that the hollow chamber 104 may be formed from the porous structure 804. Illustratively, the material (silicon) of the porous structure 804 may migrate and/or diffuse forming a hollow chamber 104 during a heat treatment performed in a hydrogen containing atmosphere. According to various embodiments, the heat treatment (anneal) may include annealing the porous structure 804 at a temperature in the range from about 900° C. to about 1100° C. (c.f. the venetia process). According to various embodiments, the pores 804h of the porous structure 804 may grow together during the thermal treatment, such that a single hollow chamber 104 may be formed, as shown in FIG. 8C. The carrier 100 illustrated in FIG. 8C may be further processed as already described, e.g. a trench structure 106 and/or one or more components 122 may be formed.

According to various embodiments, the region 802r in the carrier 100 defining the size of the porous structure 804 may be selected by providing different types of doping in the region 802r and in the part of the carrier 100 surrounding the region, since the formation of the porous structure 804 may be influenced by doping the carrier.

According to various embodiments, the support structure 108 may be designed to be easily destroyed by applying a mechanical force on the first region 102a of the carrier 100 (on the cap region), e.g. for performing a so-called Pick, Crack & Place™ process to spatially separate and/or remove the first region 102a of the carrier 100 (the SON-structure or the SOI-structure) from the carrier 100.

According to various embodiments, the first region 102a of the carrier 100 may be removed (spatially removed or detached) from the carrier 100, e.g. after an electronic component 122 may have been formed in the first region 102a of the carrier 100, as already described.

Alternatively, the first region 102a of the carrier 100 may be utilized to manufacture an electronic device including a SON-structure or SOI-structure, e.g. to electrically separate a first electronic component from a second electronic component.

According to various embodiments, a carrier may include: a cavity (hollow chamber) laterally extending within the carrier providing a first region of the carrier being vertically separated from the carrier; and a support structure vertically extending within the cavity connecting the first region of the carrier with the underlying carrier, wherein at least a part of a surface of the support structure is spaced apart from an inner surface of the hollow chamber, and wherein the support structure includes an electrically insulating oxide.

According to various embodiments, a method for manufacturing a carrier may include: forming a support structure into a carrier; forming a recess structure into the carrier, the recess structure surrounding the support structure; and performing an anneal process such that a cavity is formed within the carrier from the recess structure, the cavity separating a cap region above the cavity from the remaining carrier below the cavity, wherein the support structure remains within the cavity connecting the remaining carrier with the first region.

According to various embodiments, a method for manufacturing a carrier may include: forming a first recess structure with a first depth into the carrier; at least partially filling the first recess structure with an electrically insulating oxide forming a support structure; forming a second recess structure with a second depth into the carrier, the second recess structure surrounding the support structure, wherein the second depth of the second recess structure is smaller than the first depth of the first recess structure; performing an anneal process such that a cavity is formed within the carrier from the second recess structure, the cavity separating a first region above the cavity from the remaining carrier below the cavity; wherein the support structure remains within the cavity connecting the remaining carrier with the first region.

According to various embodiments, a carrier may include: a cavity (hollow chamber) spaced apart from a surface of the carrier; at least one support structure within the cavity connecting a first region of the carrier disposed over the cavity with a second region of the carrier disposed below the cavity, wherein at least a part of a surface of the at least one support structure is spaced apart from an inner surface of the hollow chamber, and wherein the at least one support structure includes an electrically insulating material.

According to various embodiments, the electrically insulating material may include at least one material from the following group of materials, the group consisting of: an oxide, a nitride, an oxynitride.

According to various embodiments, the electrically insulating material may include at least one material from the following group of materials, the group consisting of: an oxide, silicon oxide, a metal oxide, a nitride, silicon nitride, a metal nitride, an oxynitride, silicon oxynitride, a metal oxynitride.

According to various embodiments, the at least one support structure may include a core region and a liner structure at least laterally surrounding the core region, the core region including the electrically insulating material.

According to various embodiments, the at least one support structure may include a core region and a liner structure at least laterally surrounding the core region, the liner structure including the electrically insulating material.

According to various embodiments, the at least one support structure may include a core region and a liner structure at least laterally surrounding the core region, the liner structure including a nitride and the core region including an oxide.

According to various embodiments, the at least one support structure may include or may be configured as at least one pillar, e.g. at least one oxide pillar.

According to various embodiments, the at least one support structure (e.g., pillar, e.g. oxide pillar) may have at least one of a cylindrical shape and a prismatic shape and may extend within the cavity from the first region to the second region of the carrier.

According to various embodiments, the carrier may further include: a trench structure extending from the surface of the carrier to the cavity, wherein the trench structure laterally surrounds at least a part of the first region of the carrier.

According to various embodiments, the carrier may further include an electronic circuit disposed at least one of over and in the first region of the carrier.

According to various embodiments, a method for processing a carrier may include: forming one or more first openings in the carrier; at least partially filling the one or more first openings with a filling material to form at least one support structure; forming an opening structure in the carrier, the opening structure at least partially laterally surrounding the at least one support structure; and performing an anneal process to form a cavity and a cap region covering the cavity from the opening structure, the cavity and cap region at least partially laterally surrounding the at least one support structure, wherein the cap region is connected to the at least one support structure.

According to various embodiments, forming the opening structure may include forming one or more second openings.

According to various embodiments, the one or more first openings may include a first depth; and wherein the one or more second may include a second depth, wherein the second depth is smaller than the first depth.

According to various embodiments, at least partially filling the one or more first openings with the filling material may include: at least partially filling the one or more first openings with at least one material from the following group of materials, the group consisting of: an oxide, a nitride, an oxynitride.

According to various embodiments, at least partially filling the one or more first openings with the filling material may include: at least partially covering inner sidewalls of the one or more first openings with a first material selected from the following group of materials, the group consisting of: an oxide, a nitride, an oxynitride; and subsequently at least partially filling the one or more first openings with a second material.

According to various embodiments, the method for processing a carrier may further include forming a material layer (e.g. an epitaxial silicon layer) over the cap region.

According to various embodiments, the method for processing a carrier may further include forming a trench structure extending from the surface of the cap region to the cavity, the trench structure laterally surrounding at least a part of the cap region.

According to various embodiments, the method for processing a carrier may further include forming an electronic circuit at least one of over and in the cap region.

According to various embodiments, the method for processing a carrier may further include spatially separating and/or removing the cap region from the carrier, e.g. performing a so-called Pick, Crack & Place™ process.

According to various embodiments, the method for processing a carrier may further include spatially removing the cap region from the carrier; e.g. performing a so-called Pick, Crack & Place™ process.

According to various embodiments, the method for processing a carrier may further include detaching the cap region from the carrier.

According to various embodiments, a method for processing a carrier may include: forming one or more first openings in the carrier; at least partially filling the one or more first openings with a filling material to form at least one support structure; forming a porous structure in the carrier, the porous structure laterally surrounding the at least one support structure; performing an anneal process to form a cavity and a cap region covering the cavity from the porous structure, the cavity and cap region laterally surrounding the at least one support structure, wherein the cap region is connected to the at least one support structure.

According to various embodiments, at least partially filling the one or more first openings with a filling material may include: at least partially filling the one or more first openings with at least one material from the following group of materials, the group consisting of: an oxide, a nitride, an oxynitride.

According to various embodiments, at least partially filling the one or more first openings with a filling material may include: at least partially covering inner sidewalls of the one or more first openings with a first material selected from the following group of materials, the group consisting of: an oxide, a nitride, an oxynitride; and subsequently, at least partially filling the one or more first openings with a second material.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A method for processing a carrier, the method comprising:
    forming one or more first openings in the carrier;
    at least partially filling the one or more first openings with a filling material to form at least one support structure;
    forming an opening structure in the carrier, the opening structure at least partially laterally surrounding the at least one support structure; and
    performing an anneal process to form a hollow chamber and a cap region covering the hollow chamber from the opening structure, the hollow chamber and cap region at least partially laterally surrounding the at least one support structure, wherein the cap region is connected to the at least one support structure.

2. The method according to claim 1,
    wherein forming the opening structure comprises forming one or more second openings.

3. The method according to claim 2,
    wherein the one or more first openings are formed with a first depth; and
    wherein the one or more second openings are formed with a second depth, wherein the second depth is smaller than the first depth.

4. The method according to claim 1,
    wherein at least partially filling the one or more first openings with the filling material comprises:
    at least partially filling the one or more first openings with at least one material from the following group of materials, the group consisting of: an oxide, a nitride, an oxynitride.

5. The method according to claim 1,
    wherein at least partially filling the one or more first openings with the filling material comprises:
    at least partially covering inner sidewalls of the one or more first openings with a first material selected from the following group of materials, the group consisting of: an oxide, a nitride, an oxynitride, and
    subsequently at least partially filling the one or more first openings with a second material.

6. The method according to claim 1, further comprising:
    forming a material layer over the cap region.

7. The method according to claim 1, further comprising:
    forming a trench structure extending from the surface of the cap region to the hollow chamber, the trench structure laterally surrounding at least a part of the cap region.

8. The method according to claim 1, further comprising:
    forming an electronic circuit over the cap region.

9. The method according to claim 1, further comprising:
    detaching the cap region from the carrier.

10. A method for processing a carrier, the method comprising:
    forming one or more first openings in the carrier;
    at least partially filling the one or more first openings with a filling material to form at least one support structure;
    forming a porous structure in the carrier, the porous structure laterally surrounding the at least one support structure; and
    performing an anneal process to form a hollow chamber and a cap region covering the hollow chamber from the porous structure, the hollow chamber and cap region laterally surrounding the at least one support structure, wherein the cap region is connected to the at least one support structure.

11. The method according to claim 10,
    wherein at least partially filling the one or more first openings with a filling material comprises:
    at least partially filling the one or more first openings with at least one material from the following group of materials, the group consisting of: an oxide, a nitride, an oxynitride.

12. The method according to claim 10, wherein at least partially filling the one or more first openings with a filling material comprises:
    at least partially covering inner sidewalls of the one or more first openings with a first material selected from the following group of materials, the group consisting of: an oxide, a nitride, an oxynitride; and
    subsequently, at least partially filling the one or more first openings with a second material.

13. A method for processing a carrier, the method comprising:
    forming a hollow chamber spaced apart from a surface of the carrier; and
    forming at least one support structure within the hollow chamber connecting a first region of the carrier disposed over the hollow chamber with a second region of the carrier disposed below the hollow chamber, wherein at least a part of a surface of the at least one support structure is spaced apart from an inner surface of the hollow chamber,
    wherein forming the at least one support structure comprises forming a core region and a liner structure at least laterally surrounding the core region, the core region comprising an electrically insulating material so that the first region of the carrier is electrically isolated from the second region of the carrier.

14. The method according to claim 13,
    wherein the liner structure comprises a nitride and the core region comprises an oxide.

15. The method according to claim 13,
wherein the liner structure completely surrounds the core region and comprises the electrically insulating material.

16. The method according to claim 13,
wherein the electrically insulating material comprises at least one material from the following group of materials, the group consisting of: an oxide, a nitride, an oxynitride.

17. The method according to claim 13,
wherein the at least one support structure has at least one of a cylindrical shape and a prismatic shape and extends within the hollow chamber from the first region to the second region of the carrier.

18. The method according to claim 13, further comprising:
forming a trench structure extending from the surface of the carrier to the hollow chamber, wherein the trench structure laterally surrounds at least a part of the first region of the carrier.

19. The method according to claim 13, further comprising:
forming an electronic circuit disposed at least one of over and in the first region of the carrier.

\* \* \* \* \*